(12) United States Patent
Naven et al.

(10) Patent No.: US 7,187,738 B2
(45) Date of Patent: Mar. 6, 2007

(54) PROCESSING HIGH-SPEED DIGITAL SIGNALS

(75) Inventors: Finbar Naven, Cheadle Hume (GB); Antony Sou, Manchester (GB); Wayne Eric Rashman, Manchester (GB)

(73) Assignee: Fujitsu Limited, Kawasaki (JP)

( * ) Notice: Subject to any disclaimer, the term of this patent is extended or adjusted under 35 U.S.C. 154(b) by 865 days.

(21) Appl. No.: 10/000,036

(22) Filed: Dec. 4, 2001

(65) Prior Publication Data

US 2002/0067787 A1 Jun. 6, 2002

(30) Foreign Application Priority Data

Dec. 6, 2000 (GB) ................................. 0029762.2

(51) Int. Cl.
*H04L 7/00* (2006.01)

(52) U.S. Cl. ..................................................... 375/355

(58) Field of Classification Search ................ 375/224, 375/228, 354, 377, 355, 359, 360, 362; 327/100, 327/141, 165, 166, 172, 176, 365; 370/395.62, 370/395.61, 395.6, 395.1, 389, 351; 398/155, 398/154, 140
See application file for complete search history.

(56) References Cited

U.S. PATENT DOCUMENTS

| | | | |
|---|---|---|---|
| 4,422,176 A | 12/1983 | Summers | |
| 4,696,019 A * | 9/1987 | Tulpule et al. | ............... 375/356 |
| 4,740,970 A | 4/1988 | Burrows et al. | |
| 4,935,942 A | 6/1990 | Hwang et al. | |
| 5,004,933 A | 4/1991 | Widener | |
| 5,081,655 A | 1/1992 | Long | |
| 5,224,070 A | 6/1993 | Fandrich et al. | |
| 5,509,037 A * | 4/1996 | Buckner et al. | ............. 375/371 |
| 5,535,343 A | 7/1996 | Verseput | |
| 5,689,533 A * | 11/1997 | Brauns et al. | ............... 375/360 |
| 6,336,181 B1 | 1/2002 | Fuzisawa et al. | |
| 6,445,252 B1 * | 9/2002 | Eilken et al. | .................. 331/34 |
| 6,668,335 B1 * | 12/2003 | Breach et al. | ............... 713/600 |

FOREIGN PATENT DOCUMENTS

| | | |
|---|---|---|
| EP | 0 942 533 | 9/1999 |
| FR | 2 692 695 | 12/1993 |
| GB | 1 259 268 | 1/1972 |
| JP | 8-202528 | 5/1996 |

* cited by examiner

*Primary Examiner*—Pankaj Kumar
(74) *Attorney, Agent, or Firm*—Staas & Halsey LLP

(57) ABSTRACT

A first transparent latch receives a first synchronised signal changing its logic state synchronously with respect to a clock signal. A second transparent latch receives a second synchronised signal output by the first latch. When the clock signal has a first logic state the first latch has a non-responsive state and the second latch has a responsive state, and when the clock signal has a second logic state the first latch has the responsive state and the second latch has the non-responsive state. The change in logic state of a third synchronised signal output by the second latch is guaranteed to occur in a particular half-cycle of the clock signal, irrespective of process/voltage/temperature (PVT) variations of the circuitry. Clock recovery circuitry may have rising-edge and falling-edge latches; circulating control pattern verification circuitry; data synchronising circuitry for converting parallel data clocked by a first clock signal into serial data clocked by a second clock signal asynchronous with the first clock signal; and data recovery circuitry for producing an offset clock signal which suits a data eye shape of a received serial data stream.

42 Claims, 17 Drawing Sheets

PROCESSING HIGH-SPEED DIGITAL SIGNALS

BACKGROUND OF THE INVENTION

1. Field of Invention

The present invention relates to processing high-speed digital signals and, in particular but not exclusively, to processing high-speed digital signals to recover clock and/or data signals from received high-speed signals.

2. Description of the Related Art

Recovery of a clock signal from a serial data stream requires that data is latched (sampled) on both the rising and falling clock edges, the data samples then being processed to produce a recovered clock signal.

When the frequency of the recovered clock signal (clock frequency) is high, bordering on the maximum speed of operation of the circuit elements making up the clock recovery circuitry, several design problems arise, as follows.

Firstly, the clock recovery circuitry will require signals which change at certain well-defined moments. It may be necessary to control the moment a control signal such as a reset signal changes to an accuracy of half a clock cycle or less. A standard reset circuit, previously considered for use in such clock recovery circuitry, is made up of two master-slave latches. With such a previously-considered reset circuit, however, it is found that at frequencies approaching the limit of the technology, it is not possible to guarantee in which half of the clock cycle a reset signal produced by the reset circuit will switch from one logical state to the other. This problem arises as the switching time of a master-slave latch varies due to manufacturing or processing tolerances, voltage margins and temperature variations (so-called PVT variation).

Secondly, the processing of the above-mentioned data samples is also problematic at very high clock frequencies. This processing is generally performed by one of two different methods. In the first method, the samples are examined during the second half of the clock cycle, and the result of the comparison is itself latched at the end of the clock cycle (i.e. the next rising clock edge). In the second method, at the end of the clock cycle (i.e. the next rising clock edge) the data samples are passed unprocessed from a first set of latches to a second set of latches. The data sample can then be examined during the next clock cycle. In this case, both samples are now aligned to the rising clock edge.

In both of the above methods the data sampled on the falling clock edge must be transferred from one latch to another latch within half a clock cycle. At frequencies bordering on the limit of the technology, this can be very difficult.

Thirdly, in clock recovery circuitry, it is also sometimes required to generate a circulating control sequence (e.g. 0111, 1011, 1101, 1110, 0111, . . . ) at the outputs of a control register. The control-register outputs are used to enable different respective latches, for example. In practice, however, the circulating control sequence may become corrupted, with the result that the enabling of the different latches is no longer performed correctly. For control registers having a small number of bits (e.g. four bits or less), the correctness of the actual individual control states (e.g. 0111, 1011, etc.) can be detected explicitly and checked. However, as the length of the control sequence increases (for example to 8 bits or more), the detection of the correct control states becomes more difficult. In particular, more gates are required to implement the circuitry for checking the correctness of the control states which inevitably leads to increased loads on the control-register outputs. At frequencies approaching the limit of the technology, such increased loading must be avoided if at all possible.

Fourthly, high-speed digital signal processing circuitry may also have a requirement to convert items of data in one form into items of data in another form. For example, it may be required to convert n-bit parallel data (n=8, for example) into a serial bit stream, for transmission at n times the frequency of the parallel data. Separate clock signals are generally provided for the parallel data and the serial data, the serial clock signal having a frequency of n times that of the parallel clock signal. A shift register or the like is used to store the parallel data temporarily before it is shifted out of the register as a serial bit stream, one bit per serial clock cycle. It is therefore necessary to be able to generate a transfer control signal at a suitable moment during each parallel clock cycle to bring about transfer of a new item of parallel data into the shift register. For example, if the parallel data is permitted to change at each rising edge of the parallel clock signal, a previously-considered approach is to use first and second series-connected latches, the first latch having the parallel clock signal as its data input and both latches being clocked by the serial clock signal. In this case, for n=8 and assuming that the parallel clock signal has a 50% mark-space ratio, the rising edge of clock cycle 4 of the serial clock signal coincides with the falling edge of the parallel clock signal. It is then expected that the first latch changes state, producing a detection signal, during clock cycle 5 of the serial clock signal as clock cycle 5 is the first cycle in which, at the rising edge of the cycle, the parallel clock signal has the low logic state. At the next serial clock cycle, clock cycle 6, the second latch changes state producing the transfer control signal, and a new item of parallel data is then transferred into the shift register from which the data would be shifted out, one bit per serial clock cycle, as the serial bit stream.

At very high frequencies approaching the limit of the technology, it is very difficult to control the relative phase of the serial clock signal with respect to that of the parallel clock signal (i.e. across all PVT and layout variations). As a result, the parallel clock may in practice have its falling edge just before, exactly at, or just after the rising edge of the serial clock in clock cycle 4. If it is before the rising edge, it is possible that the first latch would produce the detection signal during clock cycle 4 instead of clock cycle 5. In the worst case, the detection signal could become dynamically unstable, i.e. be produced randomly at either serial clock cycle 4 or 5. This would cause items of data to be transferred to the shift register at varying intervals of 7, 8 or 9 serial clock cycles.

Fifthly, in previously-considered data recovery circuitry, a clock which is recovered from the incoming serial data stream is used to latch the serial data stream. However, depending on the shape of the data eye in the serial data stream it may be desirable to use a clock which is offset from the recovered clock to perform the serial data latching. The simplest method for producing such an offset clock signal would be to delay the recovery clock signal using a delay element. However, this has inherent disadvantages, and in particular the delay is hard to control across process, voltage and temperature variations. Furthermore, such a delay element is difficult to control from outside the clock recovery circuitry and can only impose a delay (rather than an advance) relative to the recovered clock signal.

BRIEF SUMMARY OF THE INVENTION

In a first aspect of the present invention signal generating circuitry comprises a first clocked element connected for receiving a clock signal and a first synchronised signal which changes its logic state synchronously with respect to said clock signal. The first clock element is switchable by the clock signal between a responsive state, in which the element is operable in response to the state change in said first synchronised signal to change a logic state of a second synchronised signal produced thereby, and a non-responsive state in which no state change in the second synchronised signal occurs. A second clocked element of the circuitry is connected for receiving the clock signal and the second synchronised signal. The second clocked element is switchable by the clock signal between a responsive state, in which the element is operable in response to the state change in said second synchronised signal to change a logic state of a third synchronised signal produced thereby, and a non-responsive state in which no state change in the third synchronised signal occurs. When the clock signal has a first logic state the first clocked element has the non-responsive state and the second clocked element has the responsive state. When the clock signal has a second logic state the first clocked element has the responsive state and the second clocked element has said non-responsive state.

In such signal generating circuitry the state change in the third synchronised signal is guaranteed always to occur in one part of a clock cycle, irrespective of PVT variations. For example, it is possible to guarantee that the third synchronised signal will always change its logic state in the first half of the clock cycle. This guarantee is possible, even when the first synchronised signal cannot be guaranteed to change state in a particular half of a cycle, for example because, at high frequencies and with PVT variation, a master/slave or full latch element used to generate the first synchronised signal has a switching time which may vary on either side of 50% of the clock period.

In one embodiment, each of the first and second clocked elements is a transparent or half latch element, for example a transparent level-sensitive latch. Such a transparent or half latch element has a shorter switching time than a master/slave or full latch element so that, even at very high frequencies, it is still possible to guarantee that the switching time of the transparent or half latch element will be less than half a clock cycle.

When a clocked element which produces the first synchronised signal switches quickly after a working edge of the clock signal (e.g. a rising edge) the state change in the first synchronising signal may occur in the first half cycle after the working edge. In this case, the first clocked element is in the non-responsive state, however, so that no change in the second synchronised signal occurs until the second half cycle after the working edge. In that second half cycle, the second clocked element is in the non-responsive state, so that no change in the third synchronised signal occurs until the third half cycle following the working edge.

When, on the other hand, the first synchronised signal does not change until the second half cycle following the working edge (because the switching time of the clocked element producing it is slow), the first clocked element is already in the responsive state when the change occurs. In this case, the state change in the second synchronised signal occurs in the second half cycle after the working edge, with the result that, as in the fast case, the third synchronised signal changes state in the third half cycle after the working edge.

In another embodiment the signal generating circuitry further comprises a third clocked element connected for receiving the clock signal and the third synchronised signal. The third clocked element is switchable by the clock signal between a responsive state, in which the element is operable in response to the state change in the third synchronised signal to change a logic state of a fourth synchronised signal produced thereby, and a non-responsive state in which no state change in the fourth synchronised signal occurs. The third clocked element has the responsive state when the clock signal has the second logic state and has the non-responsive state when the clock signal has the first logic state.

In this embodiment, it can be guaranteed that the change in the fourth synchronised signal will occur in the fourth half cycle following the working edge. The third clocked element is preferably a transparent or half latch element.

In a second aspect of the present invention clock recovery circuitry is operable to perform a repeating series of N cycles, where $N \geq 2$. N rising-edge latches are each connected for receiving a stream of serial data and are each triggered at a rising edge of a different one of the N cycles of the repeating series to take a rising-edge sample of the data. N falling-edge latches are each connected for receiving the data stream and are each triggered at a falling edge of a different one of the N cycles of the repeating series to take a falling-edge sample of the data. Sample processing circuitry processes the samples to recover a clock signal from the data stream.

In such clock recovery circuitry the data sampled on the falling clock edge need not be transferred from one latch to another latch within half a cycle, and up to N−0.5 cycles are available. For example, when N is 4, up to 3.5 cycles are available for carrying out such transfer.

In such clock recovery circuitry, enabling signals needed for triggering the rising-edge and falling-edge latches must be controlled accurately. In one embodiment, therefore, the clock recovery circuitry has a controller for generating N output signals, each output signal having an active state for an individually corresponding one of the N cycles of the said repeating series and having an inactive state in each non-corresponding cycle of the series. N processing circuits are provided, each having an input for receiving a different one of said N output signals, and each comprising one of the said rising-edge latches and one of the said falling-edge latches, and also comprising an enable signal generator having signal generating circuitry embodying the aforesaid first aspect of the present invention. The first synchronised signal is provided by the output signal received by the processing circuit. One of the third and fourth synchronised signals is applied as an enabling signal to the rising-edge latch of the processing circuit and the other of the third and fourth synchronised signals is applied as an enabling signal to the falling-edge latch of the processing circuit.

In this embodiment, because the third and fourth synchronised signals are guaranteed to change state in particular half cycles (e.g. the third and fourth half cycles after the working edge), the rising-edge and falling-edge enabling signals are guaranteed to change state at the right times spaced apart by only half a clock cycle, irrespective of PVT variations.

A third aspect of the present invention provides verification circuitry, for connection to a circulating control register to verify that a predetermined N-bit control pattern is circulating correctly through the register. The register has N storage elements, each for storing one bit of the control pattern. One bit of the control pattern has a first value and each other bit has a second value. The verification circuitry comprises a first check circuit which is connected operatively to a first set of two or more consecutive storage elements of the register and which produces a first check signal. The first check signal has a first state when any of the storage elements of the first set has the first value, and has a second state when all of the storage elements of the first set have the second value. A second check circuit is connected operatively to the remaining storage elements of the register which form a second set of two or more consecutive storage elements. The second check circuit produces a second check signal which has a first state when any of the storage elements of the second set has the first value and which has a second state when all of the storage elements of the second set have the second value. A same state detection circuit is connected to the first and second check circuits and produces a detection signal, indicating that the control pattern is incorrect, when the first and second check signals have the same state.

Such verification circuitry can be implemented simply using only simple combinatorial logic gates such as AND or NAND gates and an exclusive OR gate. Furthermore, the loading imposed on the circulating control register by the circuitry can be desirably low, so that high-speed operation is not compromised.

Such a circulating control register may be used, for example, in conjunction with the above-mentioned controller in clock recovery circuitry embodying the aforesaid second aspect of the invention or with a counter (described below) in data synchronising circuitry embodying a fourth aspect of the present invention.

A fourth aspect of the present invention provides data synchronising circuitry for receiving successively first items of data and for outputting successively second items of data derived from the received first items. One of the first items is received in each cycle of a first clock signal and one of said second items is output in each cycle of a second clock signal having a frequency N times that of the first clock signal, where N is an integer. A reset signal generator causes a reset signal to be changed from an active state to an inactive state at a preselected point in a first-clock-signal cycle. A counter is connected for receiving the second clock signal and the reset signal and is operable, following the change of the reset signal to the inactive state, to count pulses of said second clock signal and to produce transfer control signals at intervals of N cycles of the second clock signal. A data converter is connected for receiving the transfer control signals and the second clock signal. The data converter accepts respective first items in response to successive ones of the transfer control signals and derives the second items from the received first items and outputs one of the second items per second-clock-signal cycle.

The second items may be derived from the first items in any suitable way by the data converter. The data converter may be a parallel-to-serial converter.

In such data synchronising circuitry, because the counter always produces transfer control signals at intervals of N cycles of the second clock signal, irrespective of PVT variations, it can be guaranteed that, even if the first clock signal varies in phase relative to the second clock signal, the first items of data will always be accepted by the data converter at intervals fixed in relation to the second clock signal.

A fifth aspect of the present invention provides data recovery circuitry for sampling a received serial data stream. A clock recovery circuit is connected for receiving a plurality of candidate clock signals having the same frequency but spaced apart one from the next in phase. The clock recovery circuit selects, as a recovered clock signal, one of the candidate clock signals that matches the received serial data stream in phase. An offset clock circuit selects, as an offset clock signal, a further one of the candidate clock signals different from the candidate clock signal selected as the recovered clock signal. A data sampling circuit samples the received data stream using the offset clock signal.

In such data recovery circuitry, the offset clock signal can be chosen freely to suit a data eye shape of the received serial data stream. The offset clock signal may have a phase lead or a phase lag with respect to the recovered clock signal, as desired.

Because the offset clock signal is selected from amongst the candidate clock signals it can be selected using a control signal provided from outside the circuitry. This makes the circuitry highly flexible.

The frequency of the candidate clock signals is preferably equal or close to the frequency of the received serial data stream.

Preferably, the selection signals used to designate one or both of the candidate clock signals selected as the recovered clock signal and the offset clock signal is/are Gray-coded signals so that unnecessary transitory phase jumps are avoided when the candidate clock signal selections are changed. For the same reason it is preferable that the first and last candidate clock signals of the plurality differ in phase from one another by substantially the same amount as the two candidate clock signals of each further pair of mutually-adjacent candidate clock signals of the plurality differ in phase from one another.

The data recovery circuitry preferably further comprises a multiphase clock signal generator including: a delay line, connected for receiving a reference clock signal having a frequency equal or close to a data rate of the serial data stream and having a series of individual delay stages from which the candidate clock signals are derived; and a delay adjustment circuit for controlling a total delay imposed by the delay stages of the series to be substantially equal to a duration of one cycle of said reference clock signal.

In this implementation, the delay adjustment circuit ensures that the phases of the candidate clock signals are tightly controlled irrespective of PVT variations.

DETAILED DESCRIPTION OF THE PREFERRED EMBODIMENTS

Before describing a preferred embodiment of the invention signal generating circuitry previously considered for use in clock recovery circuitry will be described with reference to FIGS. 1 and 2.

Figure 1:
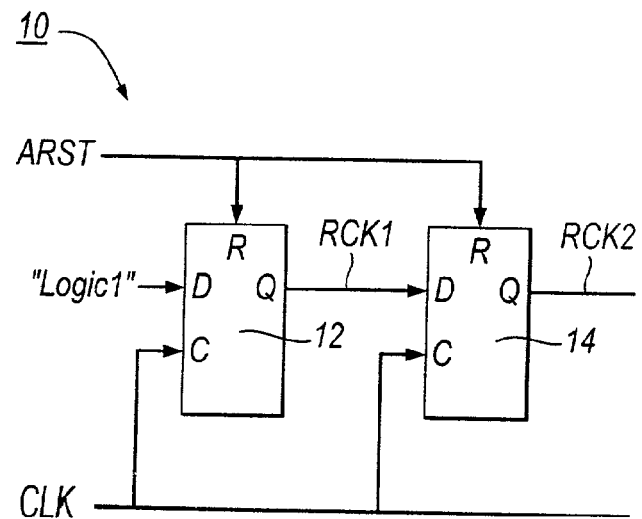
FIG. 1 shows an example of signal generating circuitry previously-considered for use in clock recovery circuitry.
Figure 2:
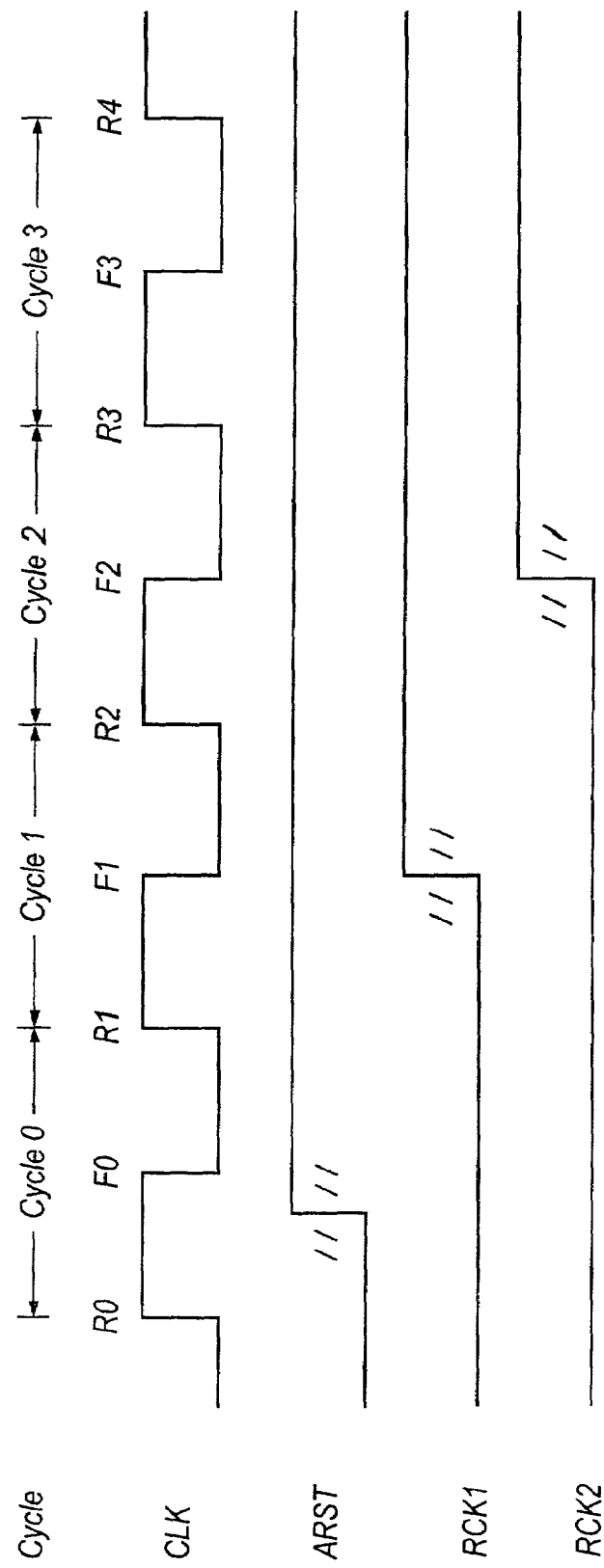
FIG. 2 is a timing diagram showing waveforms generated in the FIG. 1 circuitry when in use.

The previously-considered signal generating circuitry 10 shown in FIG. 1 comprises a first latch element 12 and a second latch element 14. Each of the latch elements 12 and 14 is, for example, a positive-edge-triggered master/slave D-type latch element.

Each of the latch elements 12 and 14 has a clock input C which is connected to receive a clock signal CLK. Each latch element 12 and 14 also has a reset input R which is connected to receive an active-low asynchronous reset signal ARST. The reset signal ARST is asynchronous with respect to the clock signal CLK. The first latch element 12 has a data input D which is connected to be at the high logic level H (logic 1). The second latch element 14 has a data input D connected to a data output Q of the first latch element 12 for receiving therefrom a first clocked reset signal RCK1. A second clocked reset signal RCK2 is produced at a data output Q of the second latch element 14.

The second clocked reset signal RCK2 is used, for example, as a reset signal for resetting clock recovery circuitry which generates enabling signals for bringing about sampling of data of an incoming serial data stream In such circuitry, removal of the reset signal must be controlled accurately in relation to the clock signal CLK.

Operation of the FIG. 1 signal generating circuitry will now be described with reference to FIG. 2. In FIG. 2 it is assumed that the asynchronous reset signal ARST is initially in the low logic state L (active) and is then removed. As the ARST signal is an asynchronous signal it can be removed at any point during a cycle of the clock signal CLK. In the example shown in FIG. 2, the ARST signal is removed at an arbitrary moment in clock cycle 0. At the first rising edge R1 following the removal of the ARST signal, the high state H at the D input of the first latch element 12 immediately before the rising edge R1 is latched at the rising edge R1 and output from the Q output of the first latch element 12. The first clocked reset signal RCK1 therefore changes from the low state L to the high state H during cycle 1. The new high state H at the D input of the second latch element 14 just before the next rising edge R2 is latched at that rising edge R2 by the second latch element 14. The resulting latched H state appears at the Q output of the second latch element 14 later during cycle 2 and provides the second clocked reset signal RCK2. Accordingly, in response to the removal of the ARST signal in cycle 0 the second clocked reset signal RCK2 changes from the L to the H state at a time during cycle 2 synchronised with the clock signal CLK.

Incidentally, the reason for employing two series-connected latch elements 12 and 14 in the FIG. 1 signal generating circuitry 10 is as follows. If the first latch element 12 alone were to be provided to produce the output signal of the circuitry (i.e. the output signal was the RCK1 signal instead of the RCK2 signal) it is possible that the ARST signal might be removed less than a predetermined minimum setup time of the first latch element 12 before the next rising edge (e.g. R1 in FIG. 2). In this case, the RCK1 signal may enter a so-called metastable state in which it remains at between the L and H states or undergoes two opposite changes of state following the rising clock edge. By providing the second latch element 14 to latch the RCK1 signal just before the following rising edge, there is an extremely high probability that the RCK2 signal will be a clean signal, even if the minimum setup time of the first latch element 12 is not met.

At frequencies approaching the limit of the circuit technology used to construct the signal generating circuitry 10, the switching time of each of the latch elements 12 and 14 is likely to be close to, and may exceed, one half of a clock cycle period. This means that in FIG. 2 it is not possible to guarantee in which half of cycle 2 the RCK2 signal will change from the L to the H state across all possible PVT and other variations. However, there are some applications in which it is vital to be able to guarantee in which half cycle the RCK2 signal will change state. Such applications include clock recovery circuitry.

Figure 3:
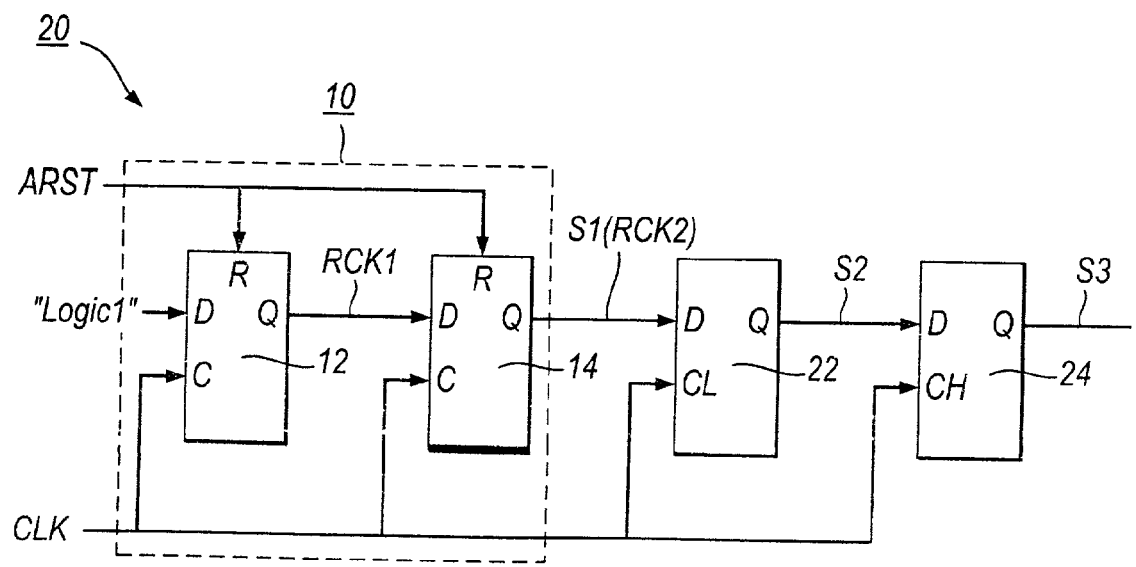
FIG. 3 shows signal generating circuitry embodying a first aspect of the present invention.

Improved signal generating circuitry, according to an embodiment of a first aspect of the present invention, is shown in FIG. 3. In FIG. 3, components of the circuitry 20 which are the same as or correspond to components of the FIG. 1 signal generating circuitry 10 are denoted by the same reference numerals, and a description thereof is omitted.

In FIG. 3, the first and second latch elements 12 and 14 are present and connected as described previously with reference to FIG. 1 to form an input circuit 10. The second clocked reset signal RCK2 is used to provide a first synchronised signal S1. The FIG. 3 circuitry further comprises a third latch element 22 and a fourth latch element 24. The third and fourth latch elements 22 and 24 are half (or transparent) latch elements, each having a data input D and a data output Q.

The third latch element 22 has an active-low clock input CL, whereas the fourth latched element 24 has an active-high clock input CH. Thus, the third latch element 22 has a responsive (open) state when its clock input CL has the L state. In this responsive state the data output Q changes in state in response to changes in state of the data input D. When the CL input has the H state the third latch element 22 is in a non-responsive (closed) state in which the data output Q does not change state in response to changes in state at the data input D.

The fourth latch element 24, on the other hand, has the responsive (open) state when its clock input CH has the H state, and is in the non-responsive (closed) state otherwise.

The data input D of the third latch element 22 is connected to the data output Q of the second latch element 14 for receiving therefrom the first synchronised signal S1 (second clocked reset signal RCK2). The data input D of the fourth latch element 24 is connected to the data output Q of the third latch element 22 for receiving therefrom a second synchronised signal S2. A third synchronised signal S3 is produced at the data output Q of the fourth latch element 24. The CL and CH clock inputs of the latch elements 22 and 24 are connected for receiving the clock signal CLK.

Figure 4:
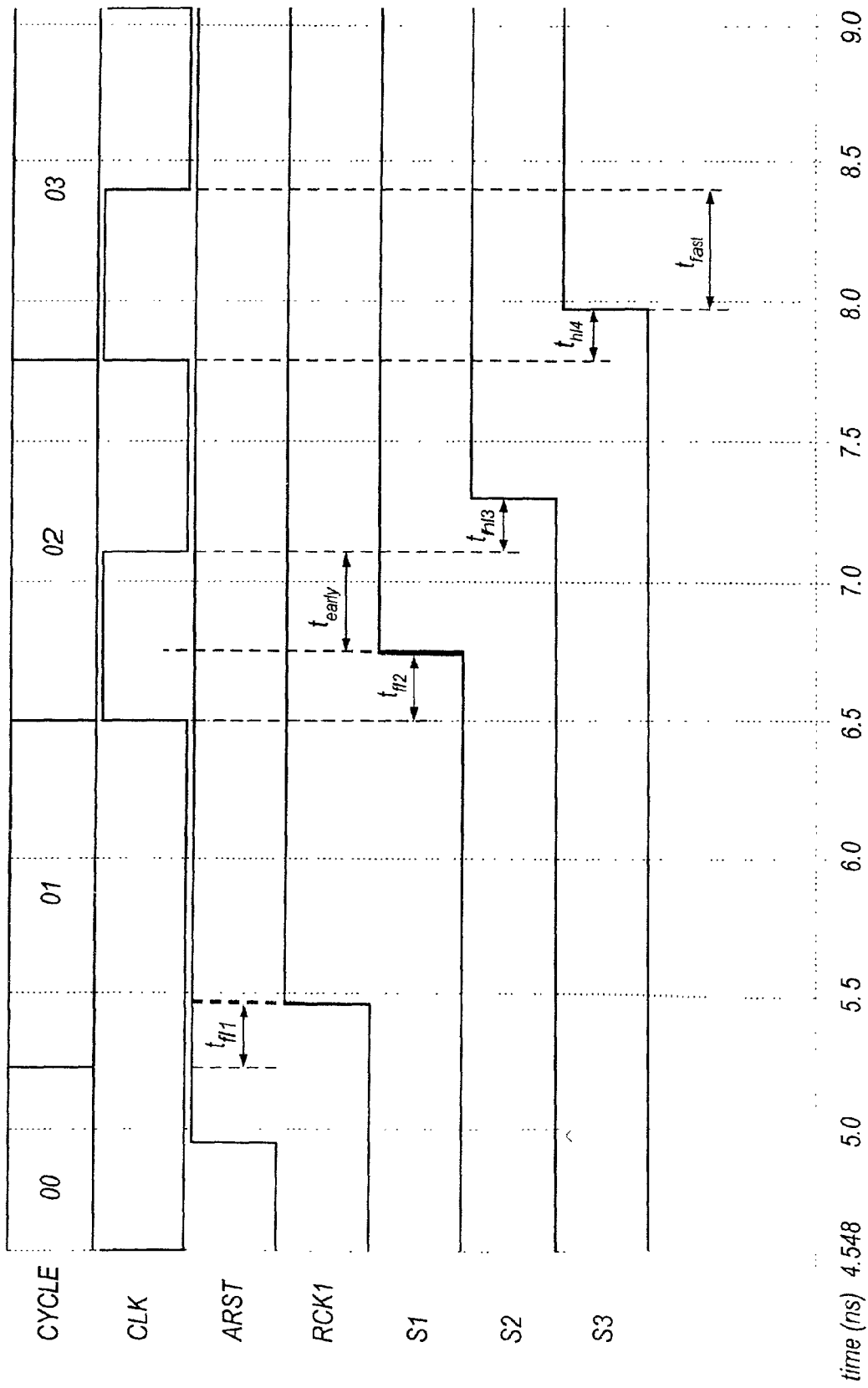
FIGS. 4 and 5 are timing diagrams showing waveforms generated in the FIG. 3 circuitry when in use.
Figure 5:
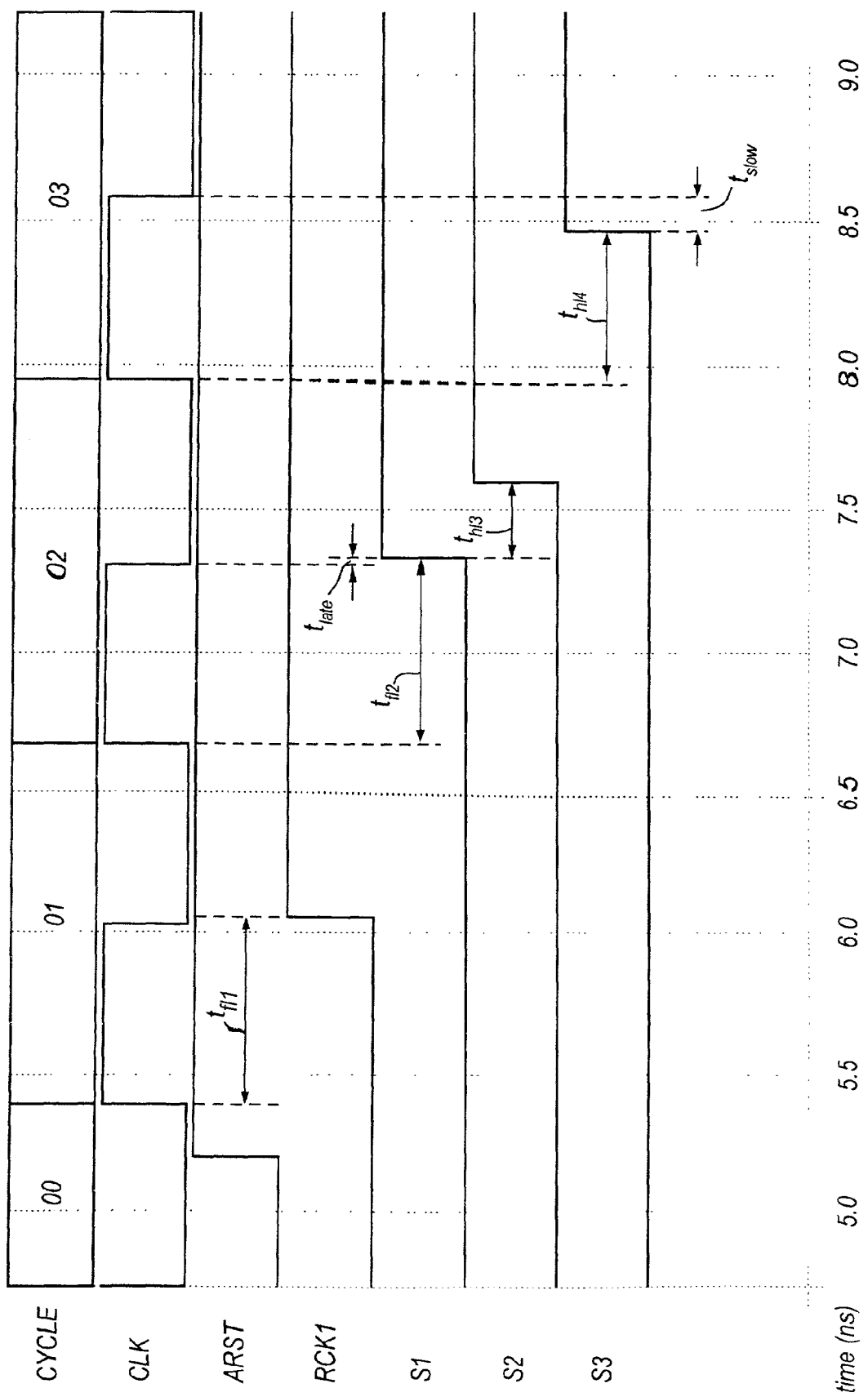

Operation of the FIG. 3 signal generating circuitry 20 will now be described with reference to FIGS. 4 and 5. FIG. 4 relates to the case in which, due to processing tolerances, voltage margins and temperature variations (PVT variations), the circuitry (in particular the first and second latch elements 12 and 14 of the input circuit 10) has fast switching times. FIG. 5 relates to the case in which, due to PVT, the signal generating circuitry 20 has slow switching times.

In both FIGS. 4 and 5 the asynchronous reset signal ARST is assumed to be removed during a clock cycle 0 of the clock signal CLK. As in the FIG. 1 circuitry, the RCK1 and S1 (RCK2) signals change from the L to the H state during clock cycles 1 and 2 respectively. In the fast case (FIG. 4) it can be seen that the S1 signal changes to the H state a time $t_{early}$ before the falling edge F2 in cycle 2. For example, when the frequency of the clock signal CLK is 622 MHz, $t_{early}$ may be 0.36 ns. Thus, in the fast case, the change in the S1 signal occurs comfortably in the first half of clock cycle 2.

In the slow case (FIG. 5), on the other hand, it can be seen that the longer switching times mean that the S1 signal only changes from the L to the H state a time $t_{late}$ after the falling edge F2 in clock cycle 2. For example, $t_{late}$ may be 0.03 ns when the clock frequency is 622 MHz. Thus, in this case, the change in state of S1 occurs in the second half of the clock cycle 2.

In the event that S1 changes to the H state in the first half of clock cycle 2 (i.e. in the fast case of FIG. 4), that change of state does not propagate through the third latch element 22 which remains in the non-responsive state until the falling edge F2. This means that the second synchronised signal S2 only changes from the L to the H state a short time $t_{hl3}$ after the falling edge F2, that short time $t_{hl3}$ corresponding to the switching time of the third latch element 22. That change in S2, however, does not propagate immediately through the fourth latch element 24 because that latch element is in the non-responsive state until the rising edge R3 at the start of clock cycle 3. Thus, the S3 signal does not change from the L to the H state until a short time $t_{hl4}$ after the rising edge R3, that short time $t_{hl4}$ corresponding to the switching time of the fourth latch element 24. Because the switching time $t_{hl4}$ of the fourth latch element 24 is small compared to the switching times $t_{fl1}$, $t_{fl2}$ of the first and second latch elements 12 and 14, it can be guaranteed that the S3 signal will change state in the first half of clock cycle 3. For example, in the fast case (FIG. 4) the change in state of S3 may occur a time $t_{fast}$ such as 0.41 ns before the falling edge F3 of clock cycle 3 when the clock frequency is 622 MHz.

In the slow case in which the S1 signal changes after the falling edge F2 in clock cycle 2, that change propagates immediately through the third latch element 22 during the second half of clock cycle 2 because at that time the third latch element 22 is in the responsive state. Thus, the S2 signal changes from the L to the H state during the second half of clock cycle 2. At this time, however, the fourth latch element 24 is still in the non-responsive state so that the S3 signal does not change from its initial L state. The change in the S3 signal from the L to the H state occurs only after the rising edge R3 when the fourth latch element 24 enters the responsive state. The delay in the change of state of the S3 signal after the rising edge R3 is determined by the switching time $t_{hl4}$ of the fourth latch element 24. Even in the slowest case as shown in FIG. 5, that switching time $t_{hl4}$ is low enough to guarantee that the change in state occurs within the first half of the clock cycle 3, i.e. a time $t_{slow}$ before the falling edge F3. For example, $t_{slow}$ is 0.11 ns when the clock frequency is 622 MHz.

Accordingly, the FIG. 3 circuitry makes it possible to guarantee that the S3 signal at the output of the signal generating circuitry will change state within the first half of a clock cycle irrespective of switching-time variations of the latch elements due to PVT and other variations.

In the FIG. 3 circuitry, it is desired to guarantee that the change of state of the final output signal (S3) of the signal generating circuitry changes state within the first half of a clock cycle. If, on the other hand, it is desired to guarantee that the change of state occurs in the second half of a clock cycle, a further latch element may be connected after the third and fourth latch elements 22 and 24 to produce a fourth synchronised signal, that further latch element having an active-low clock input CL. This possibility is described later with reference to FIG. 8.

Similarly, in the FIG. 3 circuitry all of the changes of state are from L to H, but this is not essential. Any changes of state can be brought about in any of the signals RCK1 and S1 to S3. Also, in the input circuit 10 it is not essential for the second latch element 14 to be provided in all cases. If the first latch element 12 comprises circuitry for minimising or eliminating any metastable state at its output RCK1 that output can be connected directly to the D input of the third latch element 22, and the second latch element 14 can be omitted.

In place of the half latch elements any suitable clocked element can be used that has a switching time which is guaranteed to be fast enough to bring about a change in the synchronised signal it produces within the required part of a clock cycle, for example a switching time of less than a half-cycle.

Next, parts of clock recovery circuitry 30 embodying a second aspect of the present invention will be explained with reference to FIGS. 6 to 11.

Figure 6:
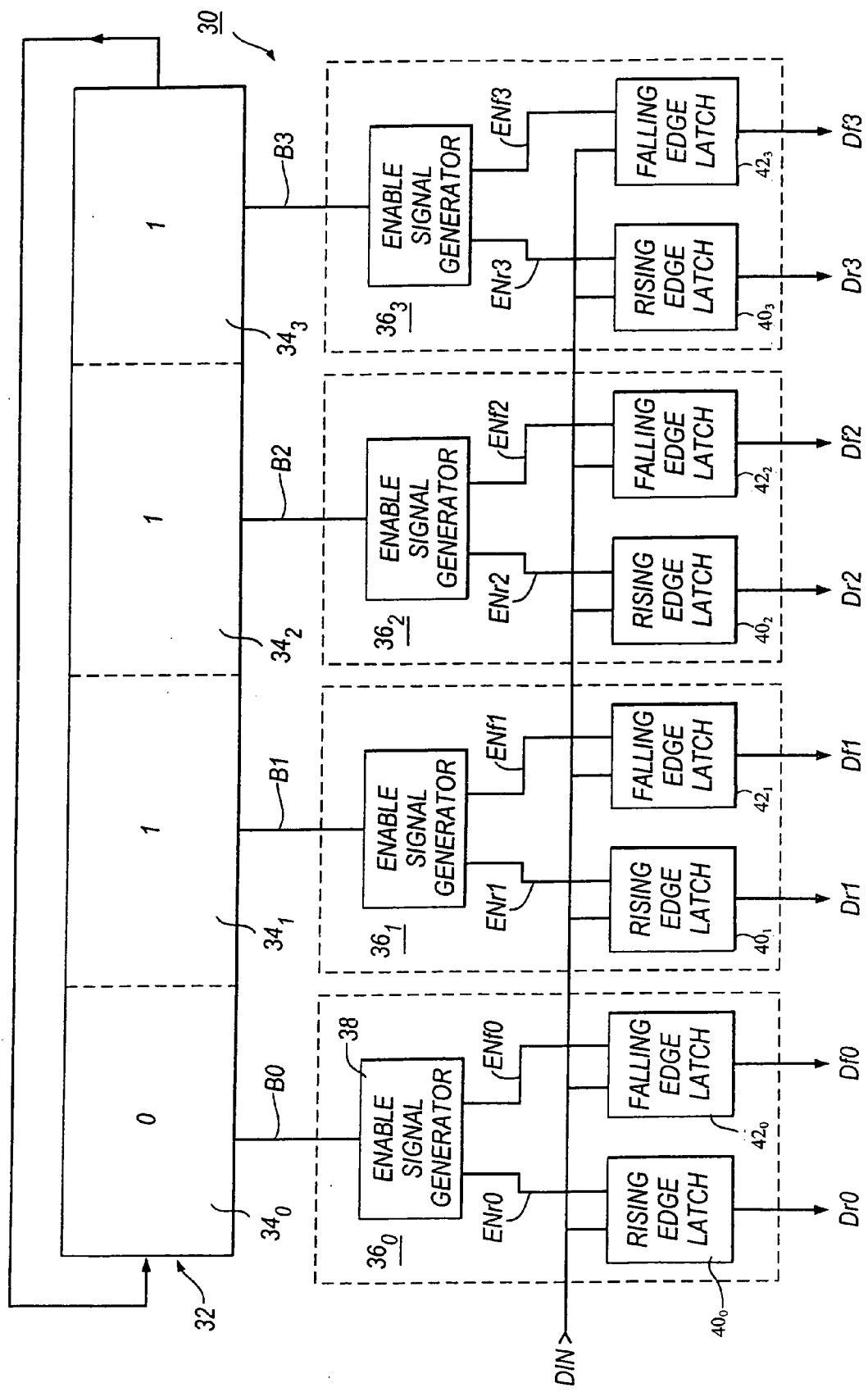
FIG. 6 shows parts of clock recovery circuitry embodying a second aspect of the present invention.

Referring firstly to FIG. 6, the clock recovery circuitry 30 comprises a circulating control register 32 having four storage elements $34_0$, $34_1$, $34_2$ and $34_3$. Each storage element $34_0$ to $34_3$ is capable of storing a 1-bit value which is output as an output signal B0 to B3 of the storage element concerned.

The clock recovery circuitry 30 in FIG. 6 also has four processing circuits $36_0$ to $36_3$, each processing circuit corresponding to one of the storage elements $34_0$ to $34_3$ of the circulating control register 32.

Each processing circuit 36 comprises an enable signal generator 38, a rising edge latch 40 and a falling edge latch 42. The enable signal generator 38 in each processing circuit 36 has an input connected to receive the output signal B0 to B3 of the corresponding storage element $34_0$ to $34_3$. The enable signal generator 38 also has a first output at which a rising-edge enabling signal ENr is generated, and a second output at which a falling-edge enabling signal ENf is generated.

The rising and falling edge latches 40 and 42 in each processing circuit each have a data input D connected to receive a serial data stream DIN. The rising edge latch 40 has an enable input E connected to receive the rising-edge enable signal ENr of the enable signal generator 38 in its processing circuit. The falling edge latch 42 has an enable input E connected to receive the falling-edge enabling signal ENf generated by the enable signal generator 38 of its processing circuit 36. The rising edge latch 40 has a data output Q at which a rising-edge data sample Dr is produced. The falling edge latch 42 has a data output Q at which a falling-edge data sample Df is produced. The data samples Dr0 to Dr3 and Df0 to Df3 produced by the different processing circuits $36_0$ to $36_3$ are employed by further circuits (not shown) within the clock recovery circuitry to recover a clock signal from the serial data stream DIN.

Figure 7:
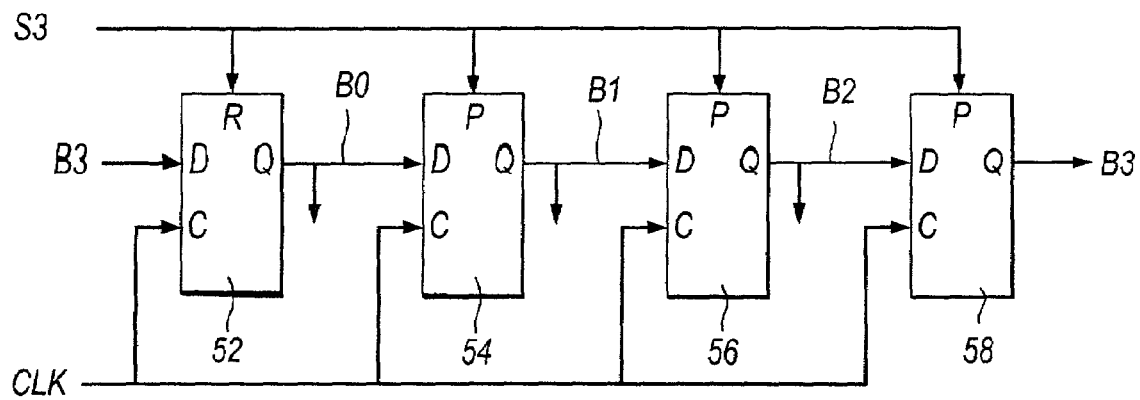
FIG. 7 is a circuit diagram showing one possible implementation of a circulating control register in the FIG. 6 circuitry.

FIG. 7 shows one example of the constitution of the circulating control register 32. In the FIG. 7 example, the control register 32 is made up of first, second, third and fourth latch elements 52, 54, 56 and 58. In this embodiment, each latch element 52, 54, 56 and 58 is a positive-edge-triggered master/slave D-type latch element. Each latch element has a data input D, a data output Q and a clock input C. The data input D of the first latch element 52 is connected to the data output Q of the fourth latch element 58. The data input of the second latch element 54 is connected to the data output Q of the first latch element 52. The data input D of the third latch element 56 is connected to the data output Q of the second latch element 54. The data input D of the fourth latch element 58 is connected to the data output Q of the third latch element 56. The respective clock inputs C of all four latch elements are connected to receive a clock signal CLK.

The first latch element 52 in FIG. 7 has an active-low reset input R, whereas each of the second to fourth latch elements 54, 56 and 58 has an active-low preset input P. The reset input R of the first latch element 52 and the respective preset inputs P of the second to fourth latch elements 54, 56 and 58 are connected to receive a reset signal which, in this example, is the synchronised signal S3 produced by the FIG. 3 signal generating circuitry embodying the aforesaid first aspect of the present invention.

In the FIG. 7 implementation of the control register 32, each latch element provides one of the storage elements $34_0$ to $34_3$ of the control register 32. Thus, the output B0 of the storage element $34_0$ in FIG. 6 is provided at the data output Q of the first latch element 52. Similarly, the data outputs Q of the second to fourth latch elements 54, 56 and 58 provide respectively the B1, B2 and B3 outputs of the control register 32.

In operation of the FIG. 7 control register 32, the register is initialised by setting the S3 signal to the active (L) state. As a result, the data output Q of the first latch element 52 is set to the L state, whilst each of the second to fourth latch elements 54, 56 and 58 has its Q output set to the H state. Accordingly, the output signals B0 to B3 are set to "0111" as shown in FIG. 6.

After the S3 signal is removed (changed to the H state) the pattern "0111" is circulated through the latch elements 52, 54, 56 and 58 in response to each rising edge of the CLK signal. Thus, the output signals B0 to B3 become "1011", "1101", "1110" and then "0111" again in a repetitive manner. In particular, each output signal B0 to B3 has the L state for one clock cycle in every four, and over a series of four consecutive cycles the four different output signals take the L state in turn.

Next, an example of the implementation of the enable signal generator 38 in each processing circuit $36_0$ to $36_3$ will be explained with reference to FIG. 8. In the FIG. 8 example it will be assumed that the enable signal generator 38 is the enable signal generator of the first processing circuit $36_0$ which receives the output signal B0 of the circulating control register 32. The enable signal generators in the remaining processing circuits $36_1$ to $36_3$ are constituted in the same way as the enable signal generator 38 of FIG. 8 but receive the output signals B1 to B3 instead.

Figure 8:
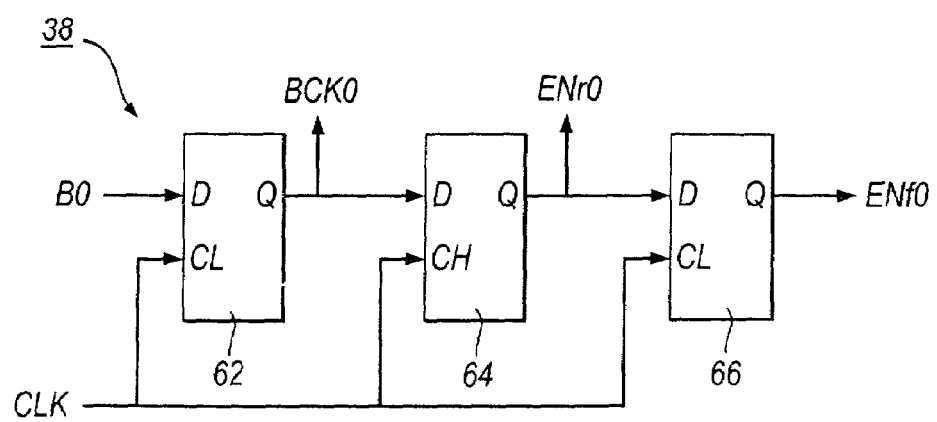
FIG. 8 is a circuit diagram showing one possible implementation of an enable signal generator in the FIG. 6 circuitry.

The FIG. 8 enable signal generator 38 is based on the FIG. 3 signal generating circuitry and comprises respective first, second and third latch elements 62, 64 and 66. In this case, the input circuit 10 in FIG. 3 is not used. The first latch element 62 in FIG. 8 corresponds to the third latch element 22 in FIG. 3; the second latch element 64 in FIG. 8 corresponds to the fourth latch element 24 in FIG. 3; the third latch element 66 in FIG. 8 is an additional latch element not present in FIG. 3. This additional latch element is also a half (or transparent) latch element.

Each latch element 62, 64 and 66 has a data input D and a data output Q. The first and third latch elements 62 and 66 each have an active-low clock input CL, and the second latch element 64 has an active-high clock input CH. The data input D of the first latch element 62 is connected for receiving the output signal B0 of the circulating control register. The data input D of the second latch element 64 is connected to the data output Q of the first latch element 62 for receiving therefrom a clocked output signal BCK0. The data input D of the third latch element 66 is connected to the data output Q of the second latch element 64. The above-mentioned rising-edge enabling signal ENr0 is produced at the data output Q of the second latch element 64, and the above-mentioned falling-edge enabling signal ENf0 is produced at the data output Q of the third latch element 66. The clock input CL or CH of each latch element 62, 64 and 66 is connected for receiving the clock signal CLK. It will be appreciated that the B0 signal in FIG. 8 corresponds to the first synchronised signal S1 in FIG. 3; the BCK0 signal corresponds to the second synchronised signal S2 in FIG. 3; and the ENr0 signal corresponds to the third synchronised signal S3 in FIG. 3.

Before describing the operation of the FIG. 8 enable signal generator an example of the implementation of the rising edge latch 40 and the falling edge latch 42 in the processing circuit $36_0$ will be given with reference to FIGS. 9 and 10, in order that the operation of the processing circuit $36_0$ as a whole can be explained.

Figure 9:
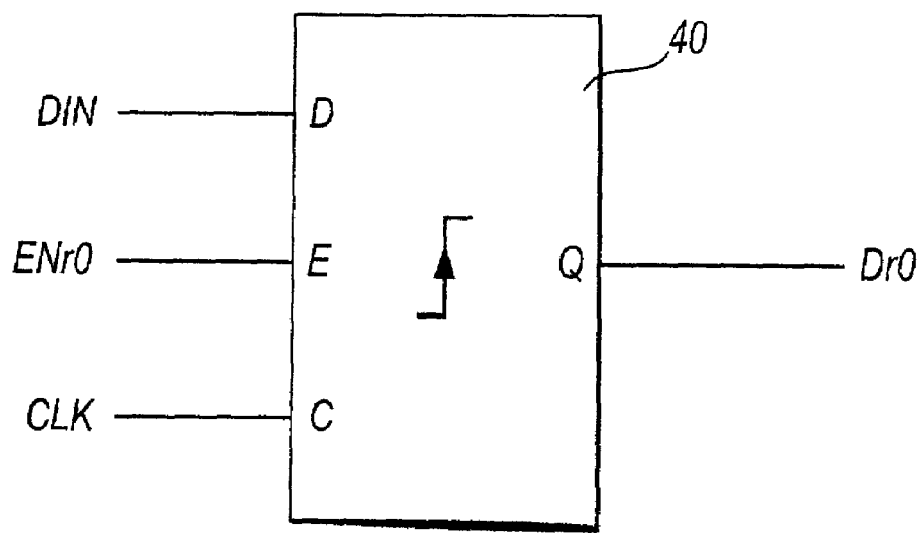
FIG. 9 is a circuit diagram showing one possible implementation of a rising edge latch in the FIG. 6 circuitry.

In FIG. 9 the rising edge latch 40 is a positive-edge-triggered master-slave D-type flip-flop. The flip-flop 40 has a data input D which receives the serial data stream DIN; an enable input E which receives the rising-edge enable signal ENr0; a clock input C which receives the clock signal CLK; and a data output Q at which the above-mentioned rising-edge data sample Dr0 is generated. The enable input E is used to switch the flip-flop 40 between an enabled state and a disabled state. In the enabled state (enable input E in the L state) the state of the D input immediately before each rising edge of the CLK signal is transmitted to the data output Q. In the disabled state (enable input E in the H state) the flip-flop 40 is not responsive to the data input D.

Figure 10:
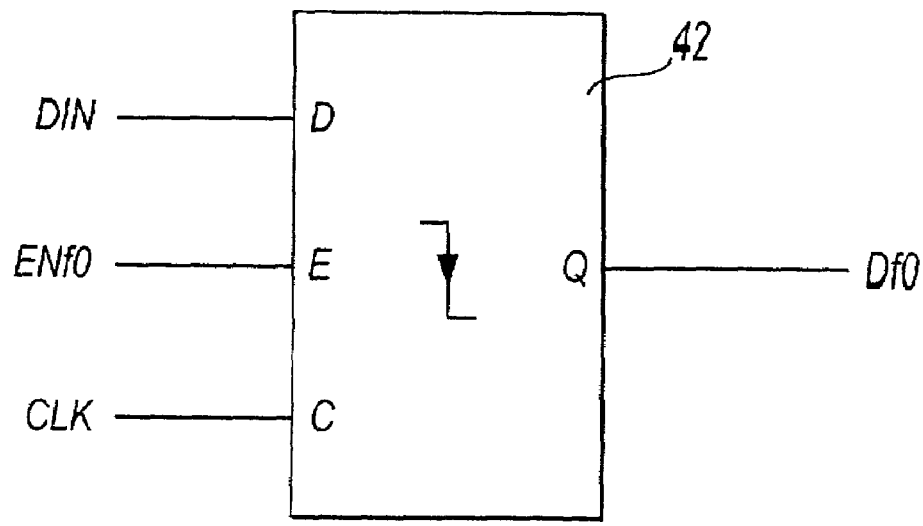
FIG. 10 is a circuit diagram showing one possible implementation of a falling edge latch in the FIG. 6 circuitry.

The falling-edge latch 42 of FIG. 10 is a negative-edge-triggered D-type flip-flop which, apart from being triggered on the falling edges of the clock signal CLK, otherwise operates in the same basic way as the flip-flop 40 of FIG. 9.

Figure 11A:
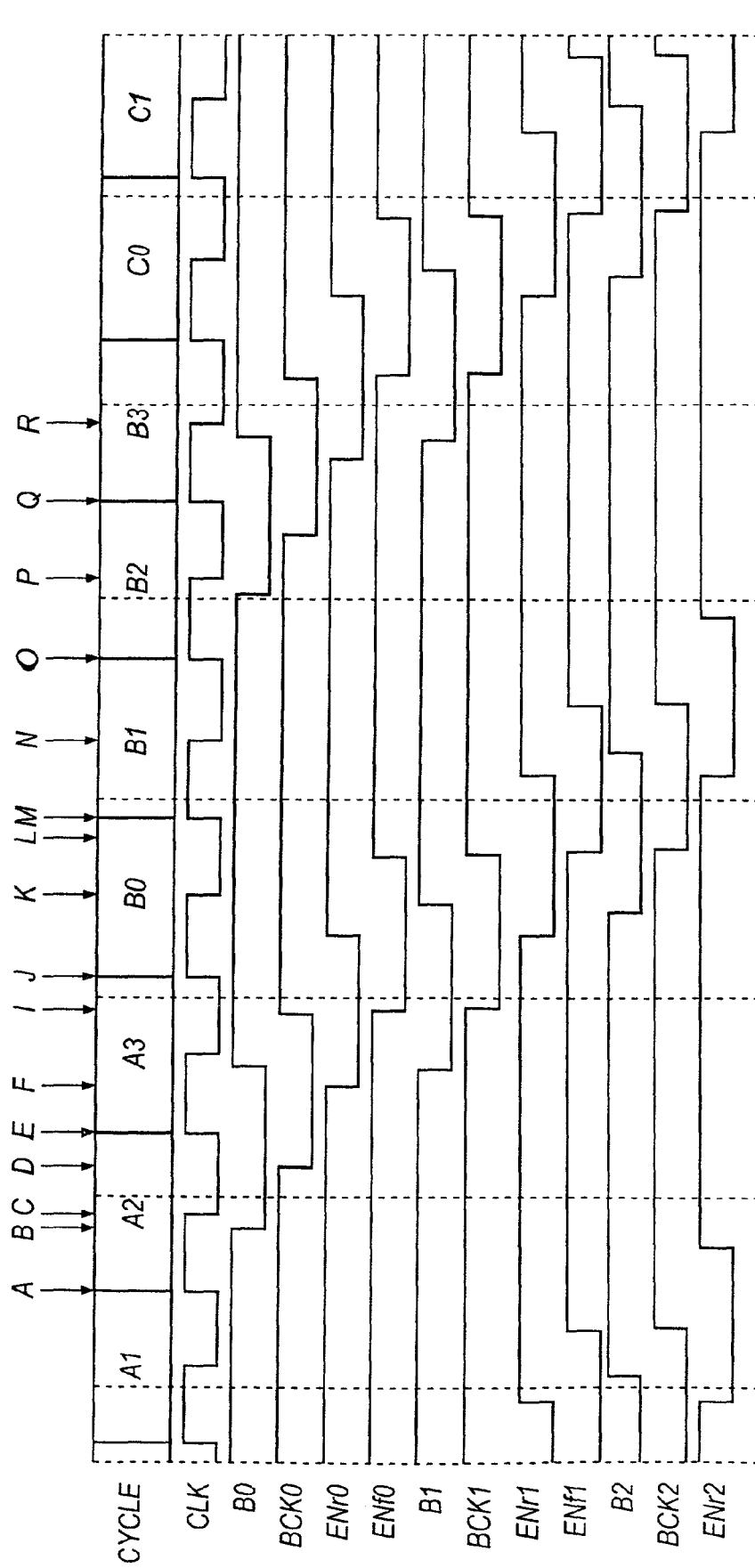
FIGS. 11(A) and (B) are timing diagrams showing waveforms generated in the FIG. 6 circuitry when in use.
Figure 11B:
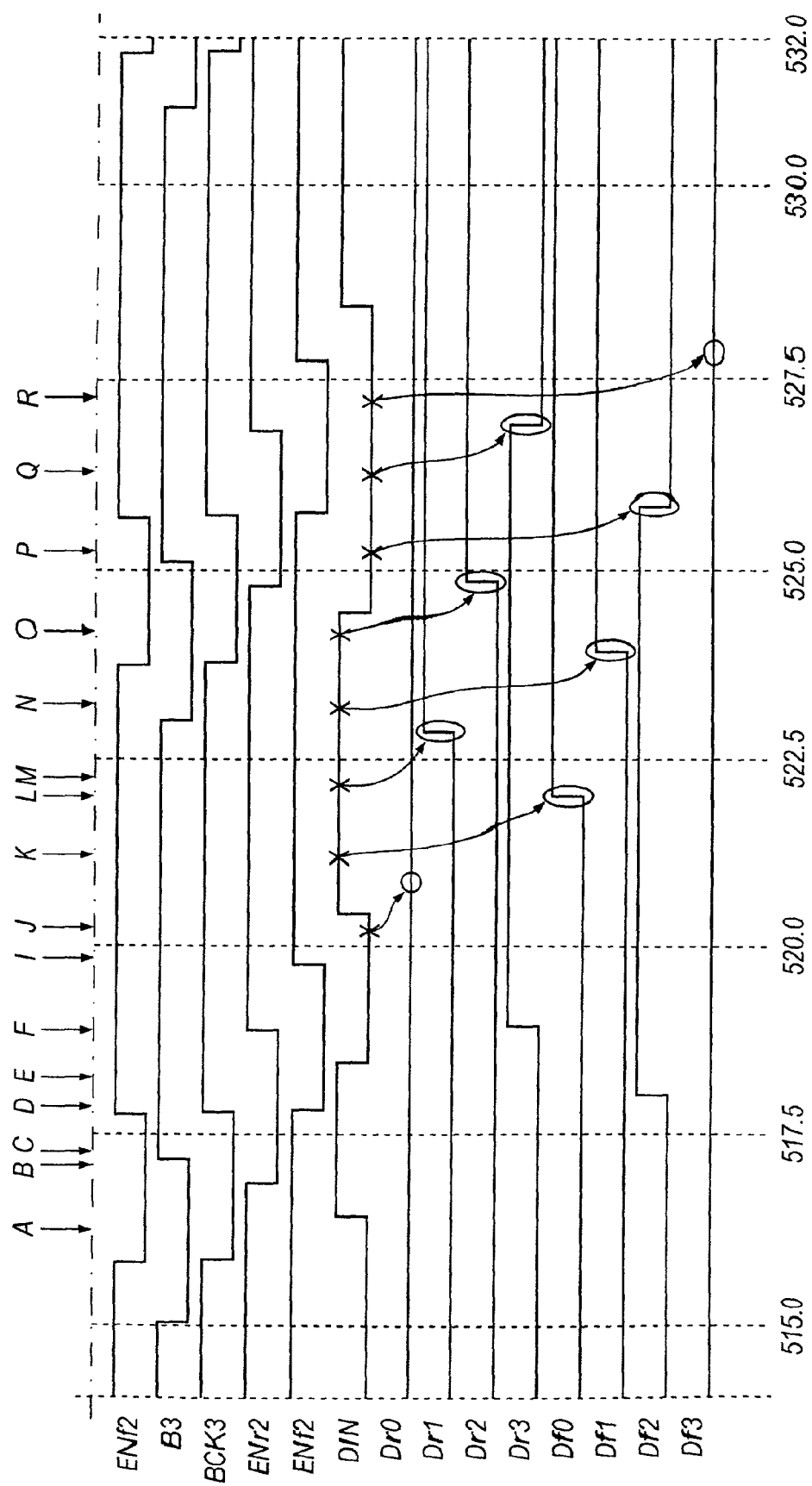

Operation of the FIGS. 6 to 10 circuitry will now be described with reference to FIGS. 11(A) and 11(B). The clock cycles of the clock signal CLK form a repeating series of four consecutive cycles A0–A3, B0–B3, C0–C3 etc., each new cycle starting at a rising edge of the clock signal. In FIGS. 11(A) and (B), only the cycles A1–A3, B0–B3 and C0–C1 are illustrated.

When the CLK signal rises at the time A the cycle A2 begins. At this time, the content of the control register 32 is 1110 (i.e. B0=1, B1=1, B2=1 and B3=0). The contents of the control register 32 just before the rising edge are shifted one storage element to the right in FIG. 6, with the content of the right-hand-most storage element $34_3$ being transferred into the left-hand-most storage element $34_0$. Thus, in this case, changes occur in the B0 and B3 signals at around a time B during clock cycle A2. Depending on the switching time of the latch elements 52, 54, 56 and 58 in FIG. 7, the time B could be in the first half of clock cycle 2 (as shown) or in the second half of clock cycle A2, as described previously with reference to FIG. 5. This variation is not important, for reasons that will be explained later.

Each signal B0 to B3 is passed to its corresponding one of the processing circuits $36_0$ to $36_3$.

The latch element 62 in each enable signal generator 38 is in a non-responsive state until the second half of clock cycle A2 begins (time C). This means that it is guaranteed that any changes in the B0 to B3 signals do not appear in the corresponding clocked signals BCK0 to BCK3 until a time D during the second half of clock cycle A2. Even if the changes in the signals B0 to B3 occur shortly after time C (as is possible if the latch elements 52, 54, 56 and 58 have long switching times due to PVT variations), it is still guaranteed that the corresponding changes in the clocked signals BCK0 to BCK3 will occur within the second half of clock cycle A2.

Any change in the BCK0 to BCK3 signals is prevented from propagating further until the first half of cycle A3 begins at time E. At that time, the latch element 64 in FIG. 8 changes from the non-responsive state to the responsive state so that the rising-edge enabling signals ENr0 to ENr3 undergo changes of state at a time F during the first half of clock cycle A3, those changes reflecting the changes in B0 to B3 which occurred at time B.

It is thus guaranteed that the rising-edge enabling signal ENr0 becomes active during the first half of clock cycle A3. That rising-edge enabling signal ENr0 is used to take a rising-edge sample Dr0 of the serial data stream DIN at time J, i.e. at the beginning of clock cycle B0. The rising edge latch 40 in the processing circuit $36_0$ therefore has a sufficient set-up time from the time F at which the enable signal ENr0 becomes active to the sampling time J. This set-up time is guaranteed to be at least half a clock cycle. Thus, at time J the state of the DIN serial data stream (L state) is sampled and is latched in the rising edge latch 40 of the first processing circuit $36_0$. The sampled data Dr0 is available at the output of that latch 40 shortly after time J.

At time I during cycle A3, the falling-edge enabling signal ENf0 changes to the active L state. Again, this change is guaranteed to occur in the second half of cycle 2 because the latch element 66 in FIG. 8 is maintained in the non-responsive state until the second half of each cycle. This means that the change in the rising-edge enabling signal ENr0 at time F does not propagate through the latch element 66 until the time I. The change of state of the falling-edge enabling signal ENf0 causes a falling-edge sample Df0 to be taken in cycle B0 at time K. This sample reflects the state of the DIN data stream just before the time K, i.e. the H state. The resulting data sample Df0 becomes available at the output of the falling edge latch 42 in the processing circuit $36_0$ at time L just before the end of cycle B0. Again, the enable set-up time for the falling edge latch 42 (from time I to time K) is guaranteed to be at least half a clock cycle.

In the next cycle B1 a new rising-edge data sample Dr1 is taken at time M, and a new falling-edge data sample Df1 is taken at time N. In cycle B2 a new rising-edge data sample Dr2 is taken at time O and a new falling-edge data sample Df2 is taken at time P. In clock cycle B3 a new rising-edge data sample Dr3 is taken at time Q and a new falling-edge data sample is taken at time R.

It will be appreciated that the enable signal generator 38 also serves to ensure that, irrespective of PVT variation, each enabling signal ENr or ENf is changed to the inactive H state within half a cycle of the relevant rising or falling edge to which it relates. For example, the rising-edge enabling signal ENr0 is changed to the inactive state within half a cycle of the falling edge of cycle B0 (time J).

It will be appreciated that in FIGS. 11(A) and (B) the rising and falling edge latches 40 and 42 of each processing circuit 36 take samples within half a clock cycle of one another. However, each latch is only updated once in every four clock cycles. For example, the latch 40 in the first processing circuit $36_0$ is next updated in cycle C0 of the next series of four cycles C0–C3. This strategy allows about 3.5 clock cycles (rather than 0.5 clock cycles as in previously-considered clock recovery circuitry) before the data samples must be transferred again to other latches or evaluated directly, which makes the further circuitry which processes the data samples much simpler to design.

In the embodiment of FIGS. 6 to 11, the circulation control register 32 has four storage elements and there are four processing circuits. However, other embodiments of the second aspect of the present invention can have different numbers of storage elements and processing circuits. For example, the number of storage elements and processing circuits could be any integer greater than or equal to 2. In general, when the number of storage elements and processing circuits is N, N−0.5 clock cycles are available before the data samples must be transferred again to other latches or evaluated directly.

As shown in FIG. 7 it is preferable that the reset signal applied to the circulating control register 30 in the initialisation operation be provided by signal generating circuitry as shown in FIG. 3. In particular, as the S3 signal produced by the FIG. 3 circuitry is guaranteed to change state in the first half of a clock cycle, irrespective of PVT variations, the set-up time before normal operation starts (with 0111 in the circulating control register 32) is guaranteed to be at least half a clock cycle.

In embodiments of the second aspect of the invention it is important that the circulating control pattern (0111) does not become corrupted, since, if it does, the data samples will be taken at the wrong times and as a result the ability to recover a clock signal from the incoming serial data stream DIN will be lost. In view of this problem, it is desirable to provide verification circuitry capable of verifying that the correct control pattern is circulating through the control register 32.

Figure 12:
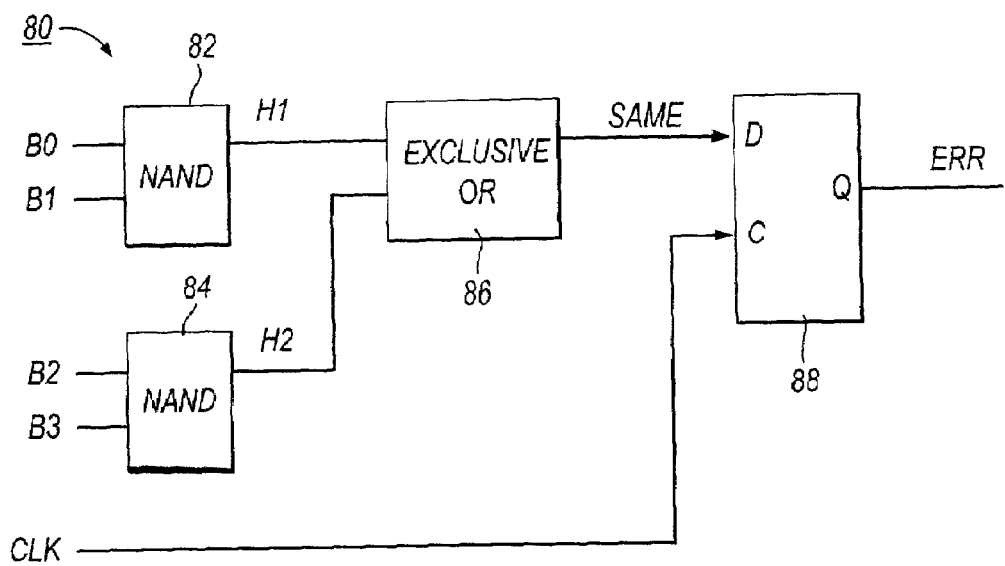
FIG. 12 shows verification circuitry embodying a third aspect of the present invention.

FIG. 12 shows one example of such verification circuitry 80. The circuitry 80 comprises respective first and second NAND gates 82 and 84, an equivalence (exclusive-OR) gate 86 and a flip-flop 88. The first NAND gate 82 is connected to receive the output signals B0 and B1 belonging to a first half of the control register 32. The second NAND gate 84 is connected to receive the outputs signals B2 and B3 of the second half of the control register 32. An output of the first NAND gate 82 is connected to a first input of the equivalence gate 86 for applying thereto a first-half check signal H1. An output of the second NAND gate 84 is connected to a second input of the equivalence gate 86 for applying thereto a second-half check signal H2. An output of the equivalence gate 86 is connected to a data input D of the flip-flop 88 for applying thereto a detection signal SAME. The flip-flop 88 also has a clock input C which is connected to receive the clock signal CLK, and a data output Q at which an error signal ERR is produced.

The verification circuitry 80 of FIG. 12 operates as follows. It is assumed that the control register 32 will continue to shift, even if the control sequence becomes corrupted. The control register 32 is divided into two halves which are checked separately. The resulting check signals for the two halves should always be different. If they are the same then corruption of the control sequence must have occurred.

The output signals B0 and B1 of the first half of the control register are NANDed together to produce the first-half check signal H1. Similarly, the second-half output signals B2 and B3 are NANDed together to produce the second-half check signal H2. If the control sequence is correct, only one of the check signals H1 and H2 can have the H state (corresponding to at least one 0 in the register half concerned). The other check signal must have the L state (corresponding to all output signals in that register half being 1). The equivalence gate 86 sets the detection signal SAME to the L state when the check signals H1 and H2 are in the same state, and sets the detection signal SAME to the H state when the check signals H1 and H2 have different states. The state of the SAME signal just before each rising edge of the CLK signal is sampled by the flip-flop 88, and this state is used to provide the ERR signal. In this way, the SAME signal is only sampled once the check signals H1 and H2 have stabilised following a circulation operation of the control register 32. The ERR signal is an active-low signal in this embodiment (because the SAME signal has the L state when the two check signals H1 and H2 have the same state, which represents corruption of the control sequence).

It will be appreciated that, because of its simplicity, the verification circuitry 80 of FIG. 12 does not positively verify the correctness of the control pattern in each cycle of the repeating series of cycles (e.g. a series of four cycles such as cycles B0 to B3 in the FIG. 6 embodiment). Thus, not all errors will be detected immediately. Nonetheless, every type of error will eventually be detected. In particular, if the control pattern becomes corrupted such that all output signals become 1, this will be detected immediately. If the control pattern becomes corrupted such that more than one output signal becomes zero this will be detected when a zero exists in each half of the control register. Thus, any incorrect number (0, 2, 3, 4 in the FIG. 6 embodiment) of circulating zeros will be detected within a small number of cycles (at most equal to the length of the pattern) without the need to search explicitly for a particular correct pattern in each cycle.

Although in the FIG. 12 embodiment the verification circuitry is adapted to check the correctness of a four-bit control register, it will be understood that other embodiments of the verification circuitry can be produced to work with control registers having a number of bits greater than 4. The two "halves" need not have equal numbers of bits. For example, with a control sequence of length 5 bits, the two halves could have 2 bits and 3 bits respectively (i.e. a 2-input NAND gate and a 3-input NAND gate). The two halves also do not have to begin and end with the first and last bits of the control register. As the control pattern circulates, the first and last bits could be in the same half. For example, with 4 bits one half could be the end bits 3 and 0 and the other half could be the intermediate bits 1 and 2.

The advantages of the verification circuitry are particularly strong for control registers having large numbers of bits, for example 8 bits or more. In this case, verification circuitry capable of positively identifying explicit correct states in all cycles would be complicated and, because of the large number of gates involved, would tend to impose an undesirably heavy load on the output signals of the control register which may be incompatible with satisfactory high-speed operation.

In place of the two NAND gates, two AND gates could be used. Alternatively, one NAND gate and one AND gate could be used.

The verification circuitry of FIG. 12 can be adapted to verify the correctness of a circulating control sequence having a single 1 with all other bits being 0 (as opposed to a single 0 with all other bits being 1). In this case, the first and second NAND gates 82 and 84 are replaced by NOR or OR gates.

Figure 13:
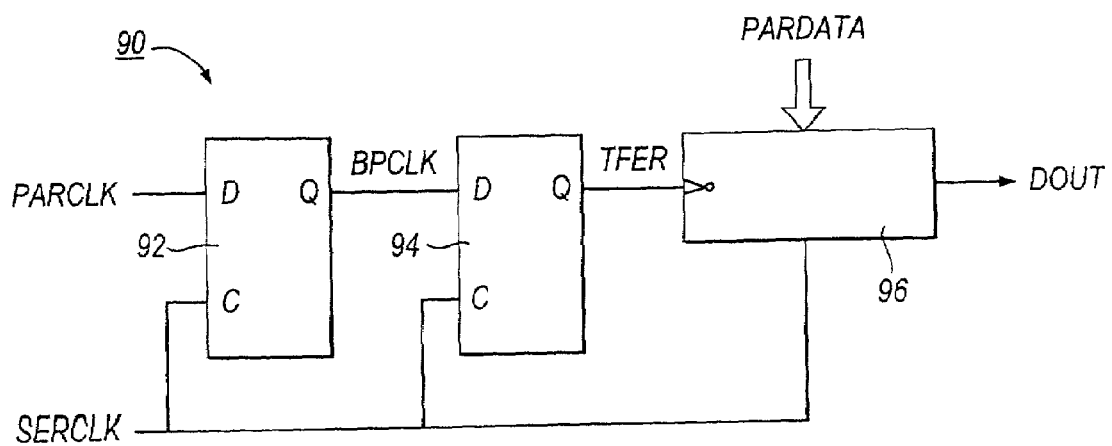
FIG. 13 shows an example of previously-considered data synchronising circuitry.

Next, embodiments of a fourth aspect of the present invention will be described. The fourth aspect of the present invention can provide a solution to a problem arising in previously-considered parallel-to-serial data conversion circuitry. FIG. 13 shows an example of a data synchronising circuit 90 in a previously-considered parallel-to-serial data converter. The synchronising circuit 90 is a so-called standard double buffer circuit having respective first and second master/slave latch elements 92 and 94. Each latch element 92 and 94 has a clock input C which is connected for receiving a serial clock signal SERCLK. A parallel clock signal PARCLK is applied to a data input D of the first latch element 92. A data output Q of the first latch element 92 is connected to a data input D of the second latch element 94 for applying thereto a buffered parallel clock signal BPCLK. A data output Q of the second latch element 94 is connected to a control input of the shift register 96 for applying thereto a transfer control signal TFER. The serial clock signal SERCLK is also applied to a clock input of the shift register 96. The shift register 96 has a parallel data input for receiving an item PARDATA of parallel data, and a serial data output for producing a serial output data stream DOUT.

Figure 14:
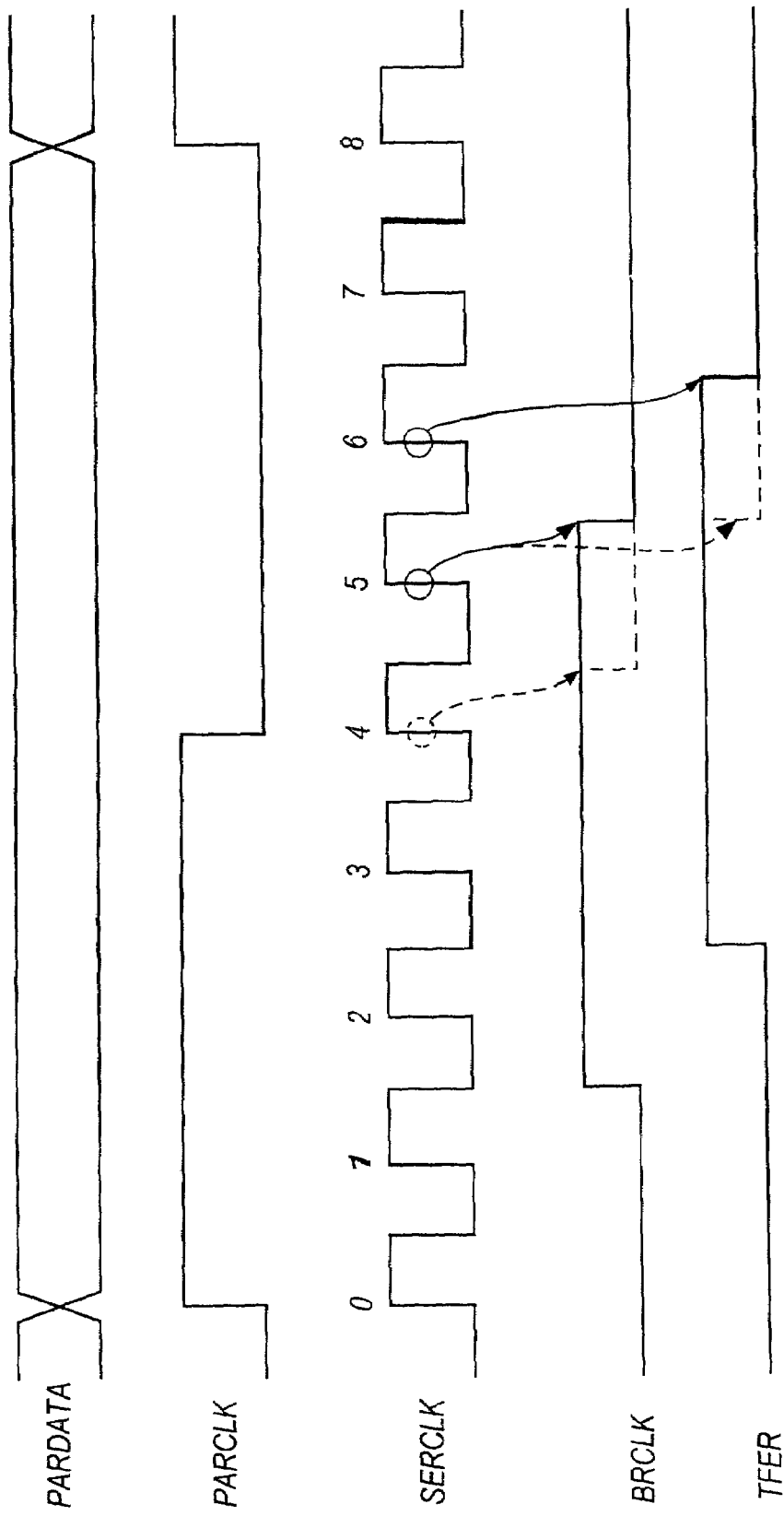
FIG. 14 is a timing diagram showing waveforms generated in the FIG. 13 circuitry when in use.

In operation, the parallel data is permitted to change at rising edges only of the parallel clock signal PARCLK. Each item of parallel data is made up of 8 bits in this example so that the serial clock frequency is 8 times the parallel clock frequency. Thus, in each cycle of the parallel clock signal PARCLK there are 8 cycles of the serial clock signal SERCLK which are numbered as cycles 0 to 7 in FIG. 14.

The parallel clock signal PARCLK changes to the L state during cycle 4 of the serial clock signal SERCLK. Thus, at the beginning of cycle 5 this change is detected and the BPCLK signal changes from H to L. This means that at the beginning of cycle 6 the transfer control signal TFER changes from H to L. The control input of the shift register 96 detects the TFER level change so that in cycle 7 a new item PARDATA of parallel data is loaded into the shift register 96. In cycle 7 and in each subsequent cycle of the serial clock signal SERCLK (i.e. cycles 0 to 6 of the next parallel clock cycle) 1 bit of the item loaded at the beginning of cycle 7 is transferred out of the shift register as serial data DOUT. Then, at the beginning of cycle 7 of the next parallel clock cycle the TFER signal has its next falling edge, so that the next item PARDATA of parallel data is loaded into the shift register.

In practice, at frequencies approaching the limit of the technology, it is very difficult to control the relative phase of the serial clock signal SERCLK with respect of that of the parallel clock signal PARCLK. Accordingly, although the serial clock cycle at which the parallel clock is first detected to have become in the L state should be clock cycle 5, it is possible that the parallel clock signal might be detected as being in the L state by the beginning of clock cycle 4. This could occur if the falling edge of the parallel clock signal PARCLK occurs just before the rising edge of the serial clock signal SERCLK in cycle 4. In this case the BPCLK and TFER signals change one cycle earlier, as shown by the dotted lines in FIG. 14. In the worst case, the detection could occur in either cycle 4 or cycle 5 on a random basis. This would result in the transfer control signal TFER being generated at varying intervals of 7, 8 or 9 cycles of the serial clock signal SERCLK, with either loss or duplication of bits in the serial data stream DOUT.

To avoid this problem, data synchronising circuitry embodying a fourth aspect of the present invention can be used.

Figure 15:
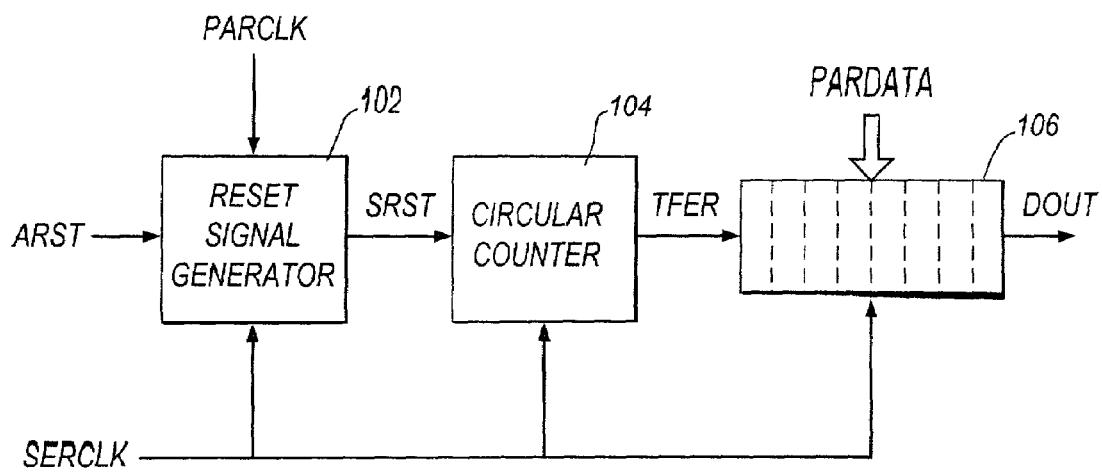
FIG. 15 shows parts of data synchronising circuitry embodying a fourth aspect of the present invention.

FIG. 15 shows an embodiment of such data synchronising circuitry. The circuitry 100 comprises a reset signal generator 102, a counter 104, and a data converter 106. The reset signal generator 102 receives both a parallel clock signal PARCLK and a serial clock signal SERCLK. In this embodiment it will be assumed that each item of parallel data to be serialised in a single clock cycle of the parallel clock signal PARCLK is made up of 8 bits, so that the clock frequency of the serial clock SERCLK is 8 times that of the parallel clock signal PARCLK.

The reset signal generator 102 receives a reset signal ARST which is removed (changed to an inactive state) asynchronously with respect to both the parallel and serial clock signals. The reset signal generator 102 applies a synchronised reset signal SRST to the counter 104. The synchronised reset signal SRST is synchronised with respect to the serial clock signal SERCLK. The counter 104 is maintained in a reset condition when the SRST signal is in an active state and is released to start counting pulses of the serial clock signal SERCLK when the SRST signal is changed by the reset signal generator 102 to the inactive state.

The counter 104 counts the number of pulses of the serial clock signal SERCLK received after the synchronised reset signal SRST is removed. After the count value reaches 7 the count value is reset to zero again. The counter 104 applies a transfer control signal TFER to the data converter 106. When the count value has a predetermined value, for example the value 3, the transfer control signal TFER is set to the active state. For all other count values the transfer control signal TFER has the inactive state.

The data converter 106 has a parallel data input for receiving an 8-bit item of parallel data. Each time the transfer control signal TFER is set to the active state by the counter 104 a new item PARDATA of parallel data is transferred into and stored in the data converter 106. The data converter 106 in this embodiment also has a serial data output at which a stream of serial data DOUT is produced. The data converter 106 receives the serial clock signal SERCLK and, when the transfer control signal TFER is in the inactive state, the bits of the stored item of parallel data in the data converter 106 are shifted out one after the next from the serial data output, one bit being output in each clock cycle of the serial clock signal SERCLK.

In the FIG. 15 data synchronising circuitry, because the counter 104 counts actual pulses of the serial clock signal, the transfer control signal TFER is guaranteed to be generated at intervals of eight cycles of the serial clock signal SERCLK irrespective of PVT variations in the circuitry. Thus, duplication or loss of data bits does not occur in the serialisation process.

Figure 16:
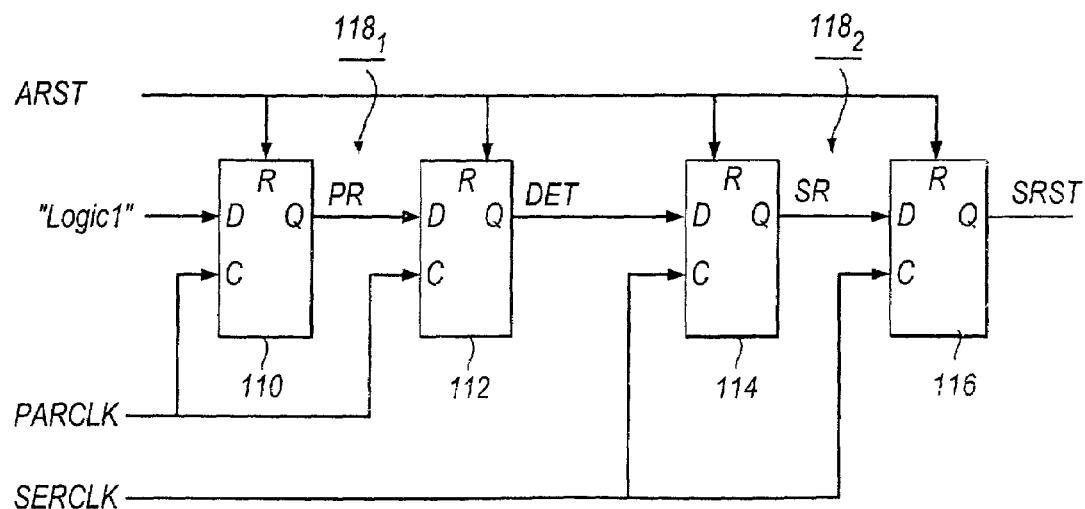
FIG. 16 is a circuit diagram showing one possible implementation of a reset signal generator in the FIG. 14 circuitry.

FIG. 16 shows an example of the implementation of the reset signal generator 102 in the FIG. 15 embodiment. In this implementation the reset signal generator 102 comprises first, second, third and fourth latch elements 110, 112, 114 and 116. Each of the latch elements is of the master/slave type and has a data input D, a clock input C, a reset input R and a data output Q. The first and second latch elements 110 and 112 form a first synchronising circuit $118_1$ whose pair of latch elements is clocked by the parallel clock signal PARCLK. The third and fourth latch elements 114 and 116 form a second synchronising circuit $118_2$ whose pair of latch elements is clocked by the serial clock signal SERCLK. All four latch elements receive at their respective reset inputs R the asynchronous reset signal ARST which, in this embodiment, is an active-low signal.

The data input D of the first latch element 110 is set permanently to the H state. The data output Q of the first latch element 110 is connected to the data input D of the second latch element 112 for applying thereto a rising signal PR synchronised with the parallel clock signal PARCLK. The data output Q of the second latch element 112 is connected to the data input D of the third latch element for applying thereto a detection signal DET synchronised with the parallel clock signal PARCLK. The data output Q of the third latch element 114 is connected to the data input D of the fourth latch element 116 for applying thereto a rising signal SR synchronised with the serial clock signal SERCLK. The synchronised reset signal SRST is produced at the data output Q of the fourth latch element 116.

Figure 17A:
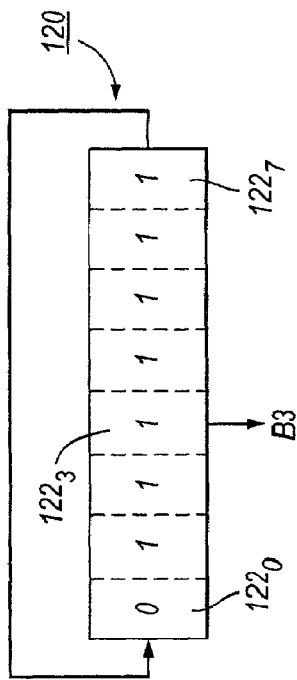
FIG. 17(A) is a block diagram showing one possible implementation of a counter in the FIG. 15 circuitry.

FIGS. 17(A) and (B) show an example of the implementation of the counter 104 in the FIG. 15 embodiment. As shown in FIG. 17(A) the counter 104 may be implemented as a circulating control register 120 similar to the circulating control register 32 in FIG. 6. In this case, the circulating control register 120 needs to have eight bits (one for each bit of the parallel data to be serialised per parallel clock signal cycle). Thus, as shown in FIG. 17(A) the circulating control register 120 has eight storage elements $122_0$ to $122_7$. Only an output signal B3 of the storage element $122_3$ is used in this embodiment. This output signal B3 may be used to provide the transfer control signal TFER directly. Alternatively, the transfer control signal TFER may be provided by passing an output signal of the circulating control register 120 through elements 22 and 24 in FIG. 3 (or elements 62, 64 and 66 in FIG. 8) In this case, the output signal may be the signal B2, instead of the signal B3. This measure can assist in meeting the setup time requirements of the logic used to parallel load the shift register. In this case, the intermediate circuitry is not needed to ensure that switching of TFER occurs in a particular half cycle (although this is guaranteed); the purpose is simply to guarantee that the setup time requirements will be met irrespective of PVT variations.

Figure 17B:
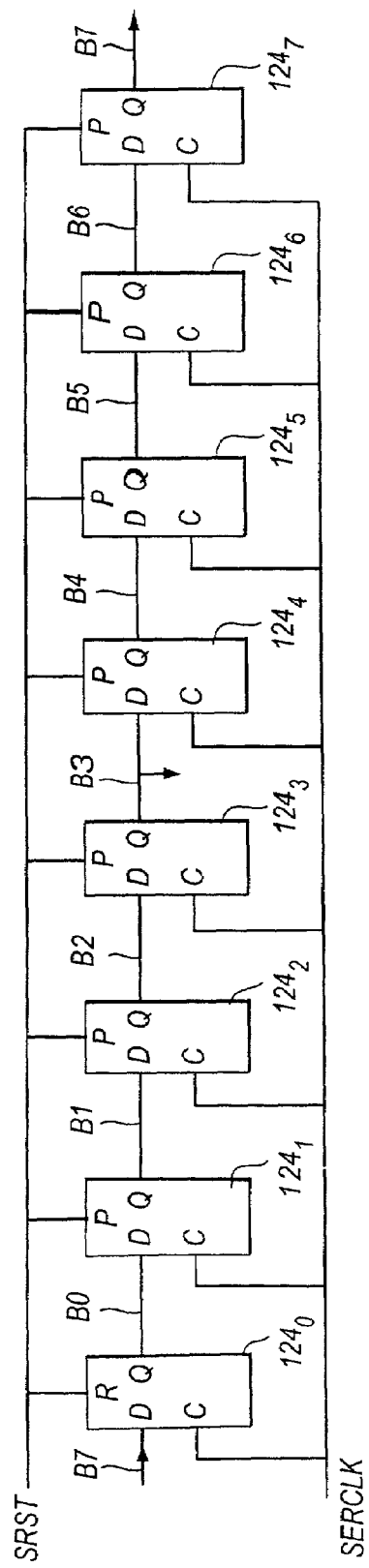
FIG. 17(B) is a detailed circuit diagram corresponding to FIG. 17(A)

As shown in FIG. 17(B) the constitution of the control register 120 is essentially the same as that of the circulating control register described previously with reference to FIG. 7, there being a master/slave latch element $124_0$ to $124_7$ for each storage element $122_0$ to $122_7$. The latch element $124_0$ has a reset input R which is connected to receive the synchronised reset signal SRST. Each of the remaining latch elements $124_1$ to $124_7$ has a preset input P which is connected to receive the synchronised reset signal SRST. Thus, when the synchronised reset signal SRST is in the active L state the output signals B0 to B7 of the latch elements $124_0$ to $124_7$ are initialised to 01111111 as shown in FIG. 17(A).

After the synchronised reset signal SRST is removed (changed to the H state) the control pattern is shifted in circular manner one position to the right in FIG. 17(A) in response to each rising edge of the serial clock signal SERCLK.

Figure 18:
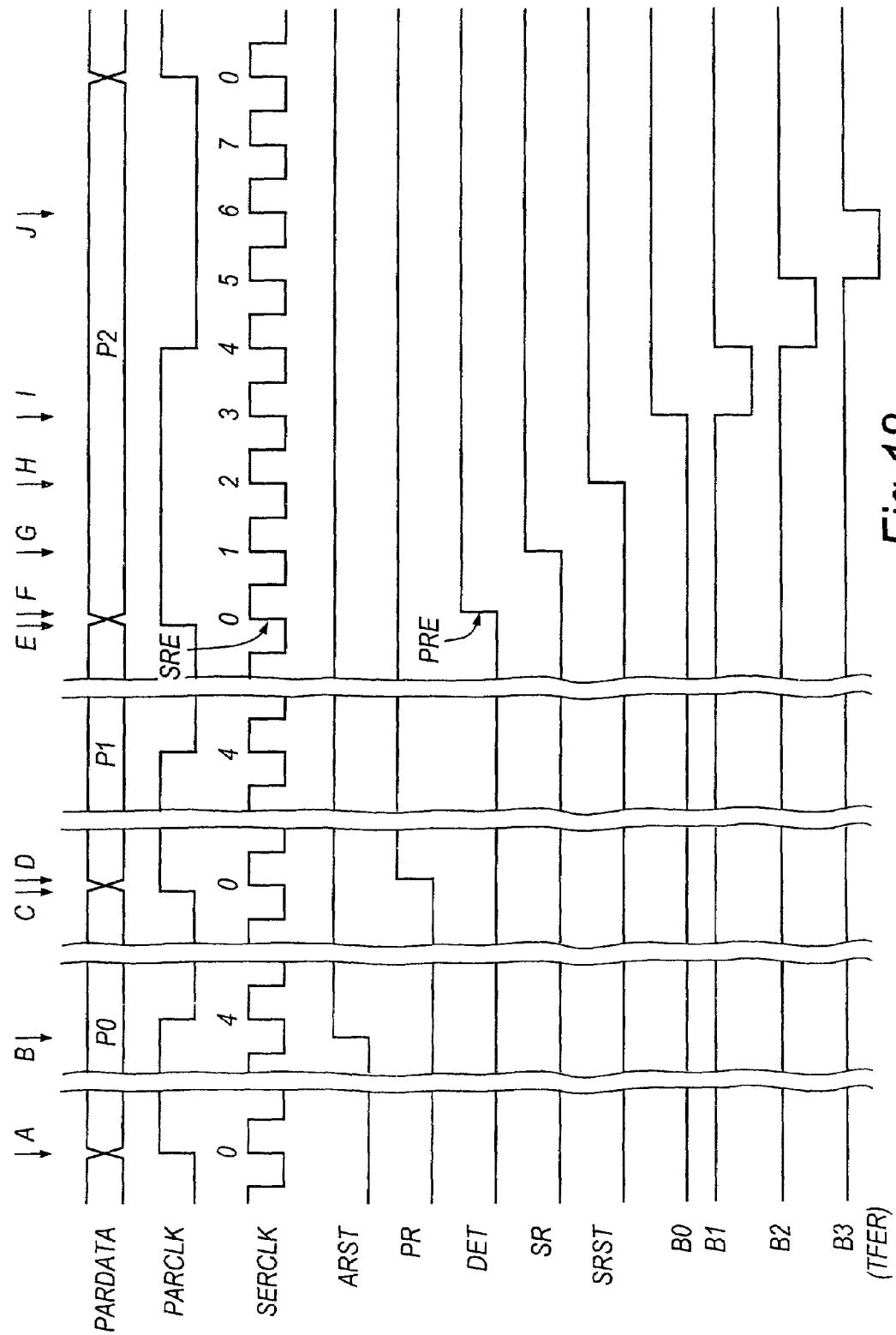
FIG. 18 is a timing diagram showing waveforms generated in the FIG. 15 circuitry when in use.

Operation of the reset signal generator 102 of FIG. 16 and the counter 104 (implemented as the circulating control register 120 of FIGS. 17(A) and (B)) will now be described with reference to FIG. 18. In FIG. 18 the parallel data PARDATA is assumed to change at rising edges of the parallel clock signal PARCLK. The eight cycles of the serial clock signal SERCLK in a given cycle of the parallel clock signal PARCLK are numbered from 0 to 7 in FIG. 18.

In FIG. 18 a new cycle P0 of the parallel clock signal PARCLK begins at a time A. At a time B during that cycle P0 the reset signal ARST is removed, i.e. the ARST signal is changed to the inactive H state from the active L state. The inactive state of the ARST signal just before the start of the next parallel clock cycle P1 at time C is detected and latched by the first latch element 110 at time C. At time D, shortly after the start of that next parallel clock cycle P1, the parallel-clock-synchronised rising signal PR changes from the L to the H state.

The same change occurs in the detection signal DET at a time F shortly after the start (at time E) of the next parallel clock cycle P2. The response by the third latch element 114 depends on the temporal relationship between the serial clock SERCLK and the parallel-clock-synchronised detection signal DET. The normal temporal relationship is as shown in FIG. 18. In this normal case, in the parallel clock cycle P2 commencing at time E the rising edge SRE of the first cycle (cycle 0) of the serial clock signal SERCLK occurs before the rising edge PRE of the parallel-clock-synchronised detection signal DET. In this case, the change in state from L to H of DET is not registered by the third latch element 114 until the rising edge of the serial clock signal SERCLK at time G. Thus, the serial-clock-synchronised rising signal SR changes from the L to the H state in serial clock cycle 1 just after time G, and the synchronised reset signal SRST undergoes the same change at a time H, just after the beginning of the serial clock cycle 2. This means that the first rising edge of the serial clock signal SERCLK at which the counter 104 starts to count is the rising edge at time I, i.e. the start of serial clock cycle 3. Accordingly, the output signal B3 (TFER) of the counter 104 becomes L for one cycle in serial clock cycle 5. Thereafter, even if the phase relationship between the parallel clock signal PARCLK and the serial clock signal SERCLK changes (e.g. due to voltage or temperature variation) it is guaranteed that the output signal B3 will become L for one serial clock cycle at intervals of exactly eight serial clock cycles.

Because of PVT variation, it is possible that the rising edge SRE could occur after the rising edge PRE. In this case, the change from L to H state in each of the signals SR and SRST will occur one serial clock cycle earlier than in FIG. 18, i.e. the change in SR will take place shortly after the beginning of serial clock cycle 0 and the change in SRST will occur shortly after the start of serial clock cycle 1. This in turn will mean that the counter 104 begins to count one serial clock cycle earlier, so that the output signal B3 will become low in serial clock cycle 4 instead of serial clock cycle 5. However, this difference is of no consequence for correct operation of the circuitry. The parallel data PARDATA will be equally stable in clock cycle 4 as it is in clock cycle 5. Also, the interval between successive active cycles of the output signal B3 (TFER) of the counter 104 is still guaranteed to be exactly eight serial clock cycles, even if the phase relationship between the parallel and serial clock signals changes or fluctuates from one parallel clock cycle to the next due to voltage and temperature variation.

Next, an example of the possible constitution of the data converter 106 will be described with reference to FIG. 19.

Figure 19:
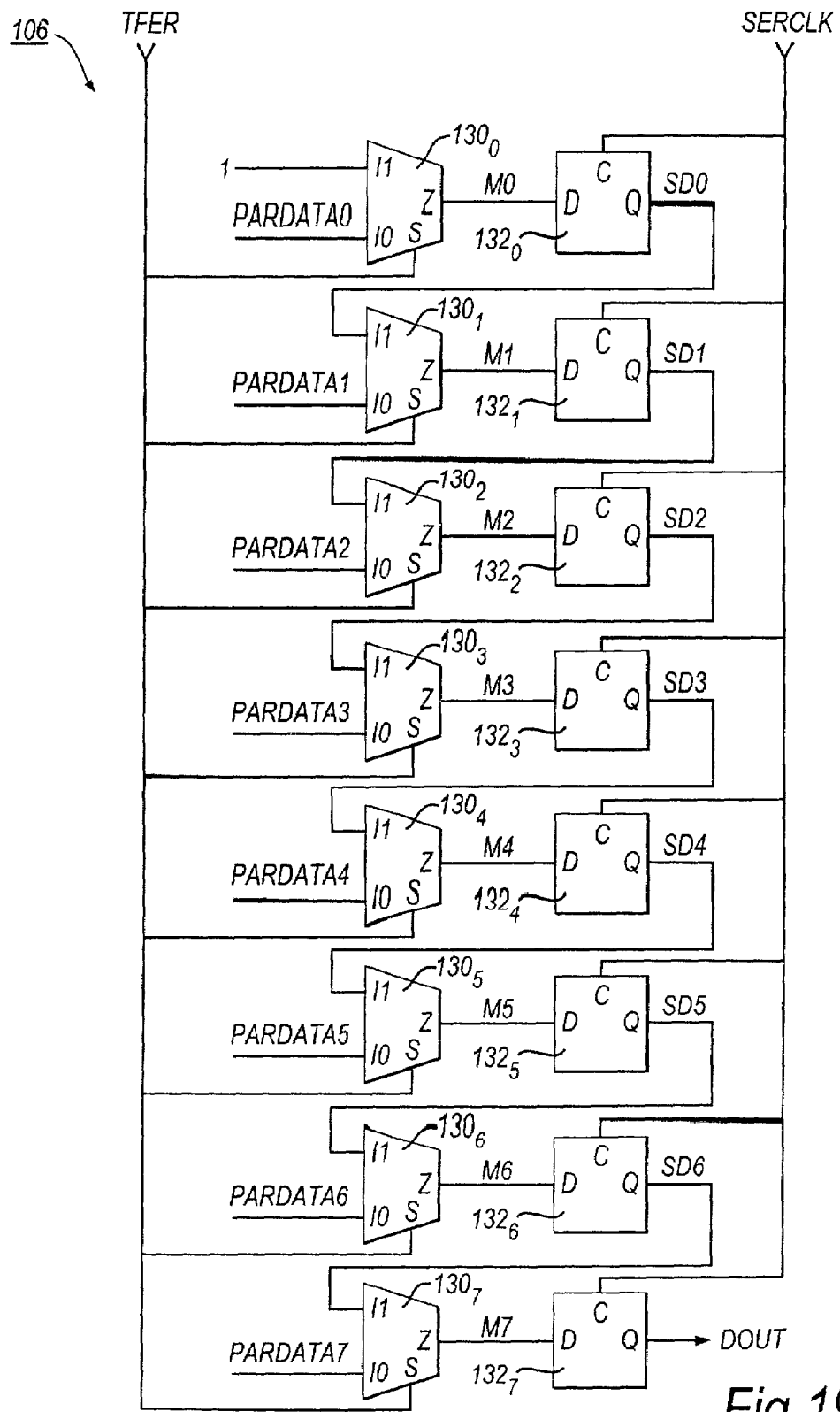
FIG. 19 is a circuit diagram showing one possible implementation of a data converter in the FIG. 15 circuitry.

In the FIG. 19 example, the data converter 106 comprises eight multiplexer elements $130_0$ to $130_7$ and eight latch elements $132_0$ to $132_7$. Each multiplexer element 130 has first and second data inputs I0 and I1, a selection input S and a data output Z. The first data input I0 of each multiplexer element $130_0$ to $130_7$ is connected for receiving one bit PARDATA0 to PARDATA7 of the parallel data PARDATA to be serialised. The second data input I1 of the multiplexer element $130_0$ is set permanently (but arbitrarily) to the H state (logic 1). The second data input I1 of each of the remaining multiplexer elements $130_1$ to $130_7$ is connected for receiving a shift data signal SD0 to SD6 produced by an immediately-preceding one of the latch elements $132_0$ to $132_6$. The transfer signal TFER is applied to each of the selection inputs S.

Each latch element has a data input D, a data output Q and a clock input C. The data input D of each latch element $132_0$ to $132_7$ is connected to the data output Z of its corresponding one of the multiplexer elements $130_0$ to $130_7$ for receiving a multiplexed output signal M0 to M7 of that multiplexer element. The above-mentioned shift data signals SD0 to SD6 are produced respectively at the data outputs Q of the latch elements $132_0$ to $132_6$. The serial data stream DOUT is produced at the data output Q of the latch element $132_7$. The clock input C of each latch element $132_0$ to $132_7$ is connected for receiving the serial clock signal SERCLK. In this embodiment, each latch element $132_0$ to $132_7$ is a positive-edge-triggered master/slave latch element.

In operation of the FIG. 19 data converter, each multiplexer element $130_0$ to $130_7$ selects its first data input I0 when its selection input S has the L state, and otherwise selects the second data input I1. The data at the selected input I0 or I1 is output at the data output Z. Accordingly, when the transfer control signal TFER has the L state the multiplexed output signals M0 to M7 become equal to the parallel data bits PARDATA0 to PARDATA7 respectively. These multiplexed output signals M0 to M7 are registered in the latch elements $132_0$ to $132_7$ respectively at the rising edge of the serial clock signal SERCLK at the start of serial clock cycle 6 in FIG. 18 (time J). Thus, in cycle 6 SD0=PARDATA0, SD1=PARDATA1, . . . SD6=PARDATA6. As DOUT=PARDATA7, the most significant bit PARDATA7 of the parallel data is output into the serial data stream DOUT in cycle 6.

Shortly after time J in FIG. 18, the TFER control signal reverts to the H state so that M0 equals 1, M1=SD0, M2=SD1, . . . and M7=SD6. This set of signals M0 to M7 is registered in the latch elements $132_0$ to $132_7$ at the next rising edge of the serial clock signal SERCLK, i.e. at the start of clock cycle 7. The parallel data bit PARDATA6 is output into the serial data stream DOUT in cycle 7.

In successive serial clock cycles each of the further bits PARDATA5 to PARDATA0 are output sequentially into the serial data stream DOUT. Then, in the next serial clock cycle, which is guaranteed to be exactly eight clock cycles after the clock cycle at time J in FIG. 18, the TFER control signal takes the L state again for one cycle, and a new item of parallel data is loaded into the latch elements $132_0$ to $132_7$.

In the embodiment of FIGS. 15 to 19 the data converter is a parallel-to-serial data converter. However, this is not an essential feature of the fourth aspect of the invention. The data converter can be adapted to convert generally first items of data into second items of data, the first items being received successively in synchronism with a first clock signal and the second items being output successively in synchronism with a second clock signal of higher frequency than the first clock signal. Both the first and second items may be parallel data. The conversion operation performed by the data converter is not limited in any way. Any number of first items may be used to produce any number of second items. The conversion operation may involve inversion or combinatorial logic operations on the bits of the received first items to produce the second items.

The design of the converter 104 is not limited to a circulating control register as shown in FIGS. 17(A) and (B). Any converter capable of counting clock pulses can be used.

When a circulating control register is used to provide the counter 104, verification circuitry embodying the third aspect of the invention is preferably used to verify that the control pattern is circulating correctly through the register.

Figure 20:
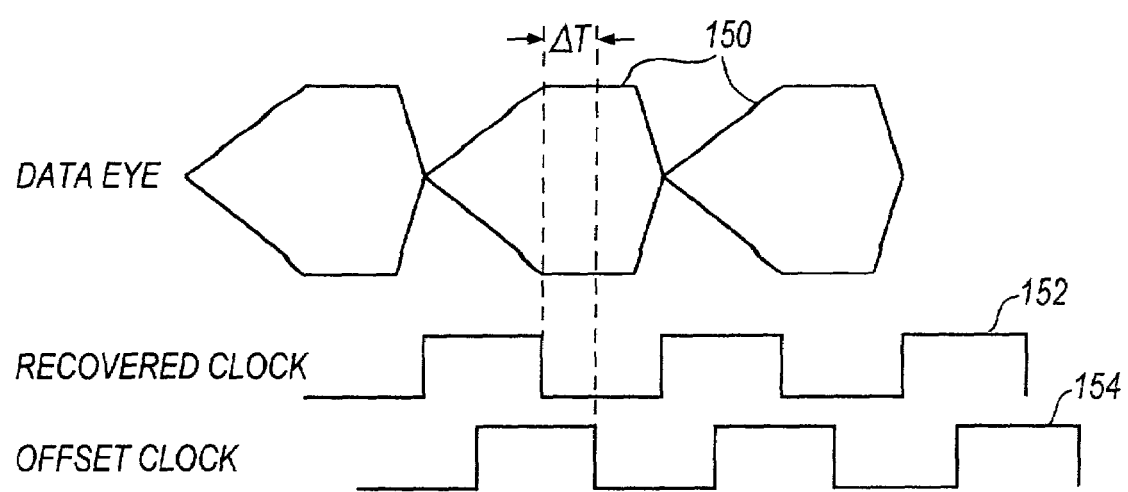
FIG. 20 is a timing diagram for use in explaining operation of data recovery circuitry.

Next, an embodiment of data recovery circuitry embodying a fifth aspect of the present invention will be described with reference to FIGS. 20 and 21. In FIG. 20 a serial data stream, received at data recovery circuitry, has a data eye 150 of a shape dependent, for example, on a characteristic of a transmission path carrying the serial data stream. In the data recovery circuitry, a clock signal 152 is recovered from the serial data stream using a phase lock loop (PLL) circuit, for example. This recovered clock signal matches the serial data stream in phase. In previously-considered data recovery circuitry, the recovered clock signal 152 is then used to latch the serial data stream.

However, depending on the shape of the data eye of the serial data stream, it may be better to use a clock signal which is offset from the recovered clock signal 152 to perform the latching of the serial data stream. For example, in the case of the data eye 150 in FIG. 20, an offset clock signal 154 which is delayed by an amount ΔT with respect to the recovered clock signal 152 would be better to use to latch the serial data stream. One possible way of producing the offset clock signal 154 would be to delay the recovered clock signal 152 using a delay element. However, in practice, producing the offset clock signal this way has disadvantages. In particular, the delay ΔT is hard to control across process, voltage and temperature (PVT) variations. Also, the delay cannot easily be controlled from outside the data recovery circuitry. Furthermore the offset clock signal 154 can only be delayed relative to the recovered clock signal 152 and cannot be advanced relative to it when a delay element is used.

Figure 21:
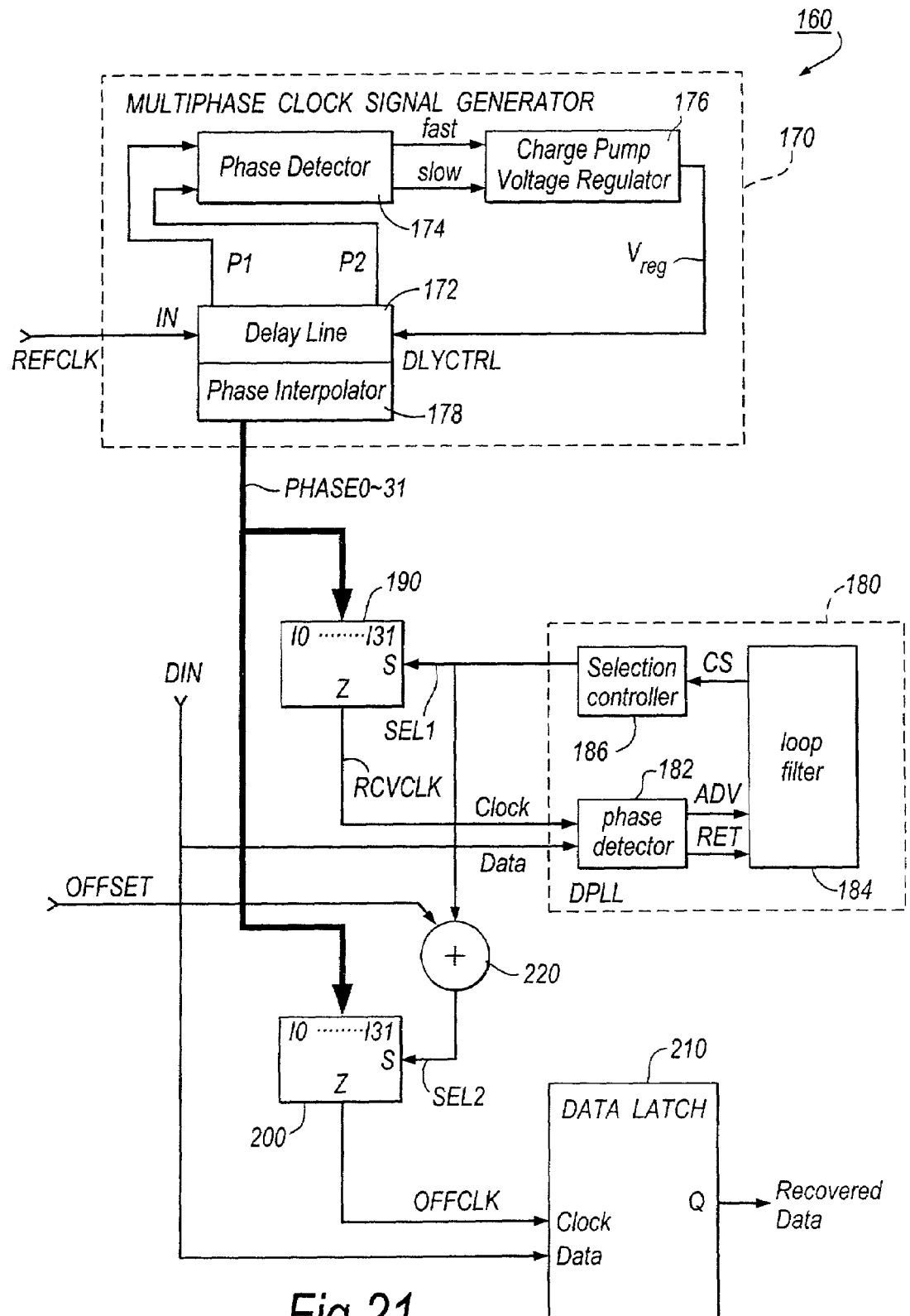
FIG. 21 shows parts of data recovery circuitry embodying a fifth aspect of the present invention.

FIG. 21 shows an embodiment of data recovery circuitry embodying a fifth aspect of the present invention. In the FIG. 21 embodiment, the data recovery circuitry 160 comprises a multiphase clock signal generator 170, a digital phase lock loop (DPLL) circuit 180, a first multiplexer element 190, a second multiplexer element 200, a data latch element 210, and an adder 220.

The multiphase clock signal generator 170 comprises a delay line 172, a phase detector 174, a charge pump voltage regulator 176 and a phase interpolator 178.

The delay line 172 in this embodiment has a series of eight delay stages, together with an input buffering stage, preceding the first delay stage of the series, and an output buffering stage following the last (eighth) stage of the series. The delay line 172 has a signal input IN at which a reference clock signal REFCLK, equal or close to the data rate of the incoming serial data stream, is received into the input buffering stage. The delay stages impose equal delays. In this embodiment, the clock frequency of the reference clock signal is 622.08 MHz (corresponding to a clock period of 1.6075 ns). The delay line 172 also has a control input DLYCTRL at which an analog control voltage $V_{reg}$, used to fractionally adjust a delay time imposed by each delay element, is received. First and second phase comparison signals P1 and P2 are output by the delay line 172 to a phase detector 174. The first phase comparison signal P1 is the buffered signal at the input of the first delay stage (i.e. after the input buffering stage of the delay line 172). The second phase comparison signal P2 is produced at an output of the last (eighth) delay stage.

In the phase detector 174 the respective phases of the first and second phase comparison signals P1 and P2 are compared. The delay of the second phase comparison signal P2 relative to the first phase comparison signal P1 is intended to be maintained at exactly one clock cycle of the reference clock signal REFCLK (i.e. a nominal total delay imposed by the delay line is 1.6075 ns). Thus, the second phase comparison signal P2 should be inphase with the first phase comparison signal P1 (but delayed by one full clock cycle relative thereto).

The phase detector 174 produces one of two control signals FAST and SLOW according to the result of the phase comparison between the signals P1 and P2. When the phase of the signal P2 is ahead of that of the signal P1 the FAST control signal is produced by the phase detector 174. When, on the other hand, the phase of the signal P2 is behind that of the signal P1 the SLOW control signal is produced by the phase detector 174. The phase detector 174 preferably comprises window detection circuitry which rejects locking on multiples or harmonics of the reference clock signal frequency.

The FAST and SLOW control signals are applied to the charge pump voltage regulator 176 which produces at its output the control voltage $V_{reg}$. The regulator 176 contains a capacitor. The amount of charge held in the capacitor is increased when the SLOW control signal is produced. Similarly, the amount of charge held in the capacitor is decreased when the FAST control signal is produced. The control voltage $V_{reg}$ is derived from the voltage across the capacitor. The delay imposed by each delay stage in the delay line 172 is dependent on the control voltage $V_{reg}$. When the control voltage $V_{reg}$ decreases, indicating that the phase of the second phase comparison signal P2 is ahead of that of the first comparison phase signal P1, the delay imposed by each delay stage increases. When, on the other hand, the control voltage $V_{reg}$ increases, indicating that the phase of the second phase comparison signal P2 is behind that of the first phase comparison signal P1, the delay imposed by each delay stage is decreased. Accordingly, the phase detector 174 and charge pump voltage regulator 176 form a feedback loop around the delay line 172, which operates to maintain or lock the total delay imposed by the eight delay stages of the delay line 172 at exactly one clock cycle of the reference clock signal REFCLK, irrespective of PVT variation.

The phase interpolator 178 receives nine basic phase signals produced by the delay line 172. The first basic phase signal is the signal produced at the output of the input stage of the delay line 172, i.e. the first phase comparison signal P1. The remaining eight basic phase signals are the delayed signals produced respectively at the outputs of the eight delay stages of the delay line 172. Thus, the ninth basic phase signal is the second phase comparison signal P2.

For each pair of adjacent basic phase signals the phase interpolator 178 produces a further three interpolated phase signals with evenly-spaced phases between the respective phases of the two basic phase signals of its pair. Thus, the phase interpolator 178 generates 24 interpolated phase signals, in addition to the nine basic phase signals generated by the delay line 172. The difference in phase between the basic and interpolated phase signals and between adjacent interpolated phase signals is 1/32 of the reference clock signal frequency, i.e. 50.23 ps in this embodiment.

One of the two "end" basic phase signals is discarded, as both of them are in-phase with the reference clock signal REFCLK. The remaining one of the "end" basic phase signals, for example the basic phase signal produced at the output of the eighth delay stage and all the remaining basic and interpolated phase signals are supplied as respective reference-clock phase signals PHASE0 to PHASE31. These 32 reference-clock phase signals PHASE0 to PHASE31 are applied to respective inputs I0 to I31 of each of the first and second multiplexer elements 190 and 200. Each multiplexer element 190 and 200 also has a selection input S and an output Z. A first selection signal SEL1 output by the DPLL circuit 180 is applied to the selection input S of the first multiplexer element 190. The first selection signal SEL1 is also applied to one input of the adder 220. The other input of the adder 220 is connected to receive a user-programmable offset signal OFFSET. A second selection signal SEL2 output by the adder 220 is applied to the selection input S of the second multiplexer element 200.

The output Z of the first multiplexer element 190 is connected to a first input of a phase detector 182 of the DPLL circuit 180. A recovered clock signal RCVCLK is produced at the Z output of the first multiplexer element 190.

An incoming serial data stream DIN is applied to a second input of the phase detector 182. The phase detector 182 determines whether the transitions in the incoming data stream DIN are ahead of, or behind, the transitions in the recovered clock signal RCVCLK. Based on the determination the phase detector 182 produces either an advance control signal ADV or a retard control signal RET. The control signals ADV and RET are applied to a loop filter 184 which controls the effective bandwidth of a phase lock loop provided by the DPLL circuit 180.

The DPLL circuit 180 may be a digital implementation of a single pole, single zero second-order loop. In this case, the loop filter 184 may provide a user-programmable and/or dynamically-variable low-pass filter function. For example, the loop bandwidth may be varied dynamically under digital control to achieve rapid acquisition of data when out of lock (wide bandwidth, wide capture range) and high rejection of jitter when in lock (narrow bandwidth, narrow lock range).

In dependence upon the ADV and RET control signals the loop filter 184 produces a control signal CS which is applied to a selection controller 186. The selection controller 186 produces the above-mentioned first selection signal SEL1 based on the control signal CS.

The first multiplexer element 190 selects one of the 32 clock phases PHASE0 to PHASE31 according to the first selection signal SEL1 and outputs the selected clock phase as the recovered clock signal RCVCLK.

The DPLL circuit 180 causes each new selection of the clock phase PHASE0 to PHASE31 to be made in dependence upon a phase difference and/or frequency difference between the incoming serial data stream DIN and the presently-selected clock phase RCVCLK. The feedback loop provided by the DPLL circuit 180 serves to tend to select, as the recovered clock signal RCVCLK, that one of the clock phases PHASE0 to PHASE31 which at any given time differs least in phase from the serial data stream DIN. When the first selection signal SEL1 reaches its maximum value, corresponding to PHASE31 at one end of the delay line 172, it changes to the minimum value, effectively wrapping around to PHASE0 at the other end of the delay line 172. Thus, there is no phase jump in going from one end of the delay line to the other. This is because a jump back from phase 31 to phase 0 is indistinguishable from a jump forward of just one phase. In addition, the first selection signal SEL1 is preferably a Gray-coded signal so that unnecessary phase jumps do not occur when changing the value of the selection signal SEL1.

The adder 220 adds together the respective values of the SEL1 and OFFSET signals to produce the SEL2 signal. The adder 220 is a modulo-32 adder in this embodiment. The value of the OFFSET signal can be positive or negative. The SEL2 signal is also preferably a Gray-coded signal.

In accordance with the value of the SEL2 signal the second multiplexer element 200 selects one of the clock phases PHASE0 to PHASE31 as the offset clock signal OFFCLK. The serial data stream DIN is therefore latched by the data latch 210 at each rising edge of the offset clock signal OFFCLK.

Because the offset clock signal OFFSET is user-programmable the phase of the offset clock signal OFFCLK can be chosen by the user to suit the particular shape of the data eye in the data stream DIN. The offset clock signal OFFCLK can be advanced or retarded relative to that of the recovered clock signal RCVCLK, giving greater flexibility. Furthermore, the phase of the offset clock signal OFFCLK relative to that of the recovered clock signal RCVCLK is controlled accurately irrespective of PVT variation in the data recovery circuitry 160.

The invention claimed is:

1. Signal generating circuitry comprising:
a first clocked element connected for receiving a clock signal and a first synchronised signal which changes its logic state synchronously with respect to said clock signal, and switchable by said clock signal between a responsive state, in which the element is operable in response to said state change in said first synchronised signal to change a logic state of a second synchronised signal produced thereby, and a non-responsive state in which no state change in the second synchronised signal occurs; and
a second clocked element connected for receiving said clock signal and said second synchronised signal, and switchable by said clock signal between a responsive state, in which the element is operable in response to said state change in said second synchronised signal to change a logic state of a third synchronised signal produced thereby, and a non-responsive state in which no state change in the third synchronised signal occurs;
wherein, when said clock signal has a first logic state the first clocked element has said non-responsive state and said second clocked element has said responsive state, and when said clock signal has a second logic state the first clocked element has said responsive state and said second clocked element has said non-responsive state.

2. Circuitry as claimed in claim 1, wherein the clock signal has alternate first and second clock edges and changes at each first clock edge from said second logic state to said first logic state and changes at each second clock edge from said first logic state to said second logic state, and a switching time of said first clocked element is less than an interval between each second clock edge and the following first clock edge, and a switching time of said second clocked element is less than an interval between each first clock edge and its following second clock edge.

3. Circuitry as claimed in claim 1, wherein each of said first and second clocked elements is a transparent or half latch element.

4. Circuitry as claimed in claim 1, wherein said state change in said first synchronising signal is permitted to occur between a first clock edge and its following second clock edge or between a second clock edge and its following first clock edge.

5. Circuitry as claimed in claim 1, further comprising an input circuit connected for receiving said clock signal and an input signal that is permitted to change its logic state asynchronously with respect to said clock signal and operable, following the said state change in the input signal, to bring about the said state change in said first synchronised signal synchronously with respect to said clock signal.

6. Circuitry as claimed in claim 5, wherein said first synchronised signal is produced by a further clocked element in said input circuit, and a switching time of said further clocked element is greater than that of each of said first and second clocked elements.

7. Circuitry as claimed in claim 6, wherein the switching time of said further clocked element is permitted to be greater than one or each of the said intervals.

8. Circuitry as claimed claim 6, wherein said further clocked element is a master/slave or full latch element.

9. Circuitry as claimed in claim 6, wherein said further clocked element has a reset input to which said input signal is applied, a data input to which a signal having a predetermined logic state is applied, and a data output at which said first synchronised signal is produced, whereby said state change in said first synchronised signal occurs after said further clocked element is released from a reset condition by said state change in said input signal.

10. Circuitry as claimed in claim 1, further comprising a third clocked element connected for receiving said clock signal and said third synchronised signal, and switchable by said clock signal between a responsive state, in which the element is operable in response to said state change in said third synchronised signal to change a logic state of a fourth synchronised signal produced thereby and a non-responsive state in which no state change in the fourth synchronised signal occurs;

said third clocked element having said responsive state when said clock signal has said second logic state and having said non-responsive state when said clock signal has said first logic state.

11. Clock recovery circuitry, adapted to receive a stream of serial data and operable to perform a repeating series of N cycles, where N>2, each said cycle having a rising edge and a falling edge, said clock recovery circuitry comprising:

N rising-edge latches, each connected for receiving said stream of serial data and each triggered at said rising edge of a different one of the N cycles of said repeating series to take a rising-edge sample of the data;

N falling-edge latches, each connected for receiving said stream of serial data and each triggered, at said falling edge of a different one of the N cycles of said repeating series, to take a falling-edge sample of the data;

a sample processing circuit which processes the rising-edge and falling edge samples to recover a clock signal from the data steam;

a controller which generates N first synchronised signals, each said first synchronised signal having an active state for an individually corresponding one of the N cycles of the said repeating series and having an inactive state in each non-corresponding cycle of the series; and N processing circuits, each comprising:

an input for receiving a different one of said N first synchronised signals;

a first clocked element connected for receiving a clock signal and said one first synchronised signal, and switchable by said clock signal between a responsive state, in which the element is operable in response to said state change in said first synchronised signal to change a logic state of a second synchronised signal produced thereby, and a non-responsive state in which no state change in the second synchronised signal occurs;

a second clock element connected for receiving said clock signal and said second synchronised signal, and switchable by said clock signal between a responsive state, in which the element is operable in response to said state change in said second synchronised signal to change a logic state of a third synchronised signal produced thereby, and a non-responsive state in which no state change in the third synchronised signal occurs;

a third clocked element connected for receiving said clock signal and said third synchronised signal, and switchable by said clock signal between a responsive state, in which the element is operable in response to said state change in said third synchronised signal to change a logic state of a fourth synchronise signal produced thereby, and a non-responsive state in which no state change in the fourth synchronised signal occurs;

wherein, when said clock signal has a first logic state the first and third clocked elements have said non-responsive state and said second clocked element has said responsive state, and when said clock signal has a second logic state the first and third clocked elements have said responsive state and said second clocked element has said non-responsive state; and each of said N processing circuits further comprising:

one of said rising-edge latches connected to be enabled by one of said third and fourth synchronised signals; and one of said falling-edge latches connected to be enabled by the other of said third and fourth synchronised signals.

12. Circuitry as claimed in claim 11, wherein the said controller comprises a circulating control register having N storage elements, each for storing one bit of an N-bit control pattern that is transferred in circular manner through the register, one bit of the said control pattern having a first value and each other bit having a second value, and each storage element providing one of the said output signals, which output signal has said active state when the bit of the control pattern stored in the storage element has said first value and which has said inactive state when that stored bit has said second value.

13. Circuitry as claimed in claim 12 wherein each said storage element comprises an edge-triggered latch element which produces the said output signal.

14. Clock recovery circuitry as claimed in claim 12, further comprising verification circuitry connected to said circulating control register of said controller for verifying that said control pattern is circulating correctly therethrough, the verification circuitry comprising:

a first check circuit, connected operatively to a first set of two or more consecutive storage elements of the register, and producing a first check signal which has a first state when any of the storage elements of the first set has said first value and which has a second state when all of the storage elements of the first set have said second value;

a second check circuit, connected operatively to the remaining storage elements of the register which form a second set of two or more consecutive storage elements, and producing a second check signal which has a first state when any of the storage elements of the second set has said first value and which has a second state when all of the storage elements of the second set have said second value; and a same state detection circuit connected to said first and second check circuits and producing a detection signal, indicating that said control pattern is incorrect, when said first and second check signals have the same state.

15. Verification circuitry, for connection to a circulating control register to verify that a predetermined N-bit control pattern is circulating correctly through the register, the register having N storage elements, each for storing one bit of the control pattern, and one bit of the control pattern having a first value and each other bit having a second value, the verification circuitry comprising:

a first check circuit, connected operatively to a first set of two or more consecutive storage elements of the register, and producing a first check signal which has a first state when any of the storage elements of the first set has said first value and which has a second state when all of the storage elements of the first set have said second value;

a second check circuit, connected operatively to the remaining storage elements of the register which form a second set of two or more consecutive storage elements, and producing a second check signal which has a first state when any of the storage elements of the second set has said first value and which has a second state when all of the storage elements of the second set have said second value; and a same state detection circuit connected to said first and second check circuits and producing a detection signal, indicating that said control pattern is incorrect, when said first and second check signals have the same state.

16. Circuitry as claimed in claim 15, wherein said first value is a zero and said second value is a one, and each said check circuit performs and AND or NAND operation on the respective stored values of the storage elements of its set.

17. Circuitry as claimed in claim 15, wherein the said first value is a one and said second value is a zero, and each said check circuit performs an OR or NOR operation on the respective stored values of the storage elements of its set.

18. Circuitry as claimed in claim 15, wherein said same state detection circuit operates to produce said detection signal at a predetermined detection time following a circulation operation of the control register when the states of the first and second check signals have stabilized.

19. Data synchronising circuitry, for receiving successively first items of data and for outputting successively second items of data derived from the received first items, one of said first items being received in each cycle of a first clock signal and one of said second items being output in each cycle of a second clock signal having a frequency N times that of the first clock signal, where N is an integer, which circuitry comprises:

a reset signal generator which causes a reset signal to be changed from an active state to an inactive state at a preselected point in a first-clock-signal cycle;

a counter connected for receiving said second clock signal and said reset signal and operable, following the change of said reset signal to said inactive state, to count pulses of said second clock signal and to produce transfer control signals at intervals of N cycles of said second clock signal; and a data converter connected for receiving said transfer control signals and said second clock signal, and operable to accept respective first items in response to successive said transfer control signals and to derive said second items from the received first items and to output one of said second items per second-clock-signal cycle.

20. Circuitry as claimed in claim 19, wherein said first items of data each have N bits and said second items of data each have a single bit.

21. Circuitry as claimed in claim 19, wherein said data converter is a parallel-to-serial converter.

22. Circuitry as claimed in claim 19, wherein:

said counter comprises a circulating control register having N storage elements, each for storing one bit of an N-bit control pattern that is transferred in circular manner through the register in successive second-clock-signal cycles, one bit of said control pattern having a first value and each other bit having a second value; and one of said transfer control signals is produced each time the bit of the control pattern stored in a predetermined one of the storage elements has said first value.

23. Circuitry as claimed in claim 19, wherein said reset signal generator is connected for receiving both said first and said second clock signals and is operable to detect a preselected change in logic state of said first clock signal and, in response to such detection, to bring about said change of said reset signal from said active state to said inactive state in synchronism with said second clock signal.

24. Circuitry as claimed in claim 19, wherein said reset signal generator comprises:

a first synchronising circuit connected for receiving said first clock signal and an input signal that is permitted to change its logic state asynchronously with respect to said first clock signal, and operable, following the said state change in the input signal, to bring about a change in logic state of a detection signal; and a second synchronising circuit connected for receiving said second clock signal and said detection signal and operable, following said state change in said detection signal, to bring about the said change of said reset signal from said active state to said inactive state in synchronism with said second clock signal.

25. Circuitry as claimed in claim 24, wherein said first synchronising circuit companies a clocked element having a clock input to which said first clock signal is applied, a reset input to which said input signal is applied, a data input to which a signal having a predetermined logic state is applied, and a data output from which said detection signal is derived, whereby said state change in said detection signal occurs after said clocked element of said first synchronising circuit is released from a reset condition by said state change in said input signal.

26. Circuitry as claimed in claim 24, wherein said second synchronising circuit comprises a clocked element having a clock input to which said second clock signal is applied, a reset input to which said input signal is applied, a data input to which said detection signal is applied, and a data output from which said reset signal is derived, whereby said state change in said reset signal occurs after said clock element of said second synchronising circuit is released from a reset condition by said state change in said input signal and after said state change in said detection signal.

27. Data synchronising circuitry as claimed in claim 22, further comprising verification circuitry connected to said circulating control register of said counter for verifying that said control pattern is circulating correctly therethrough, the verification circuitry comprising:
  a first check circuit, connected operatively to a first set of two or more consecutive storage elements of the register, and producing a first check signal which has a first state when any of the storage elements of the first set has said first value and which has a second state when all of the storage elements of the first set have said second value;
  a second check circuit, connected operatively to the remaining storage elements of the register which form a second set of two or more consecutive storage elements, and producing a second check signal which has a first state when any of the storage elements of the second set has said first value and which has a second state when all of the storage elements of the second set have said second value; and
  a same state detection circuit connected to said first and second check circuits and producing a detection signal, indicating that said control pattern is incorrect, when said first and second check signals have the same state.

28. Data recovery circuitry, for sampling a received serial data stream, comprising:
  a clock recovery circuit connected for receiving a plurality of candidate clock signals having the same frequency but spaced apart one from the next in phase, and operable to select, as a recovered clock signal, one of said candidate clock signals that matches said received serial data stream in phase;
  an offset clock circuit operable to select, as an offset clock signal, a further one of said candidate clock signals different from said candidate clock signal selected as said recovered clock signal; and
  a data sampling circuit operable to sample said received data stream using said offset clock signal, wherein said offset clock circuit is operable to select, as said offset clock signal, one of said candidate clock signals that leads said recovered clock signal in phase.

29. Data recovery circuitry, for sampling a received serial data stream, comprising:
  a clock recovery circuit connected for receiving a plurality of candidate clock signals having the same frequency but spaced apart one from the next in phase, and operable to select, as a recovered clock signal, one of said candidate clock signals that matches said received serial data stream in phase;
  an offset clock circuit operable to select, as an offset clock signal, a further one of said candidate clock signals different from said candidate clock signal selected as said recovered clock signal; and
  a data sampling circuit operable to sample said received data stream using said offset clock signal, wherein said offset clock circuit is connected for receiving an offset clock signal and is operable to select said further one of said candidate clock signals in dependence upon the received offset clock signal.

30. Circuitry as claimed in claim 29, wherein said offset control signal is a user-adjustable control signal.

31. Circuitry as claimed in claim 29, wherein said clock recovery circuit generates a first selection signal for designating the candidate clock signal selected as said recovered clock signal, and said offset clock circuit generates a second selection signal, for designating the said further candidate clock signal selected as said offset clock signal, based on said first selection signal and said offset control signal.

32. Circuitry as claimed in claim 31, wherein one or each of said first and second selection signals is a Gray-coded signal.

33. Circuitry as claimed in claim 31, wherein said offset clock circuit comprises a modulo-N adder which adds said offset control signal to said first selection signal to produce said second selection signal, where N is the number of candidate clock signals in the said plurality.

34. Circuitry as claimed in claim 29, wherein a maximum absolute phase difference between any two of said candidate clock signals of said plurality is 180°.

35. Circuitry as claimed in claim 29, wherein said candidate clock signals of said plurality are spaced substantially equally in phase one from the next.

36. Circuitry as claimed in claim 29, wherein said clock recovery circuit comprises a digital phase lock loop circuit.

37. Data recovery circuitry, for sampling a received serial data stream, comprising:
  a clock recovery circuit connected for receiving a plurality of candidate clock signals having the same frequency but spaced apart substantially equally in phase, one from the next, and operable to select, as a recovered clock signal, one of said candidate clock signals that matches said received serial data stream in phase;
  an offset clock circuit operable to select, as an offset clock signal, a further one of said candidate clock signals different from said candidate clock signal selected as said recovered clock signal; and
  a data sampling circuit operable to sample said received data stream using said offset clock signal, wherein:
    a last one of the candidate clock signals of said plurality differs in phase from a first one of said candidate clock signals of said plurality by substantially the same amount as the two candidate clock signals of each further pair of mutually-adjacent candidate clock signals of said plurality differ in phase from one another.

38. Data recovery circuitry, for sampling a received serial data stream, comprising:
  a clock recovery circuit connected for receiving a plurality of candidate clock signals having the same frequency but spaced apart one from the next in phase, and operable to select, as a recovered clock signal, one of said candidate clock signals that matches said received serial data stream in phase;
  an offset clock circuit operable to select, as an offset clock signal, a further one of said candidate clock signals different from said candidate clock signal selected as said recovered clock signal; and
  a data sampling circuit operable to sample said received data stream using said offset clock signal; and
  a multiphase clock signal generator including:
    a delay line, connected for receiving a reference clock signal having a frequency equal or close to a data rate of said serial data stream and having a series of individual delay stages from which said candidate clock signals are derived, and
    a delay adjustment circuit which controls a total delay imposed by the delay stages of said series to be substantially equal to a duration of one cycle of said reference clock signal.

39. Circuitry as claimed in claim 38, wherein said delay adjustment circuit receives a first phase comparison signal applied to an input of a first one of the delay stages of said series, and a second phase comparison signal produced at an output of a last one of the delay stages of said series, and is operable to control the said total delay so that said first and second phase comparison signals are maintained at substantially the same frequency but with transitions in said second phase comparison signal being substantially aligned with corresponding transitions in said first phase comparison signal.

40. Circuitry as claimed in claim 38, wherein the delay stages of said series are fewer in number than said candidate clock signals of said plurality, and said multiphase clock signal generator further includes a phase interpolator connected for receiving a plurality of basic phase signals produced by the delay stages of said series and operable to produce a plurality of interpolated phase signals having phases intermediate between the respective phases of the basic phase signals.

41. Data recovery circuitry, for sampling a received serial data stream, comprising:
   a clock recovery circuit connected for receiving a plurality of candidate clock signals having the same frequency but spaced apart one from the next in phase, and operable to select, as a recovered clock signal, one of said candidate clock signals that matches said received serial data stream in phase;
   an offset clock circuit operable to select, as an offset clock signal, a further one of said candidate clock signals different from said candidate clock signal selected as said recovered clock signal; and
   a data sampling circuit operable to sample said received data stream using said offset clock signal, wherein said clock recovery circuit compares the respective phases of said received serial data stream and the candidate clock signal currently selected as said recovered clock signal, and selects a next candidate clock signal from amongst the candidate clock signals of said plurality based on the comparison results.

42. Verification circuitry, for connection to a circulating control register to verify that a predetermined N-bit control pattern is circulating correctly through the register, the register having N storage elements, each for storing one bit of the control pattern, and one bit of the control pattern having a first value and each other bit having a second value, the verification circuitry comprising:
   first check means, connected operatively to a first set of two or more consecutive storage elements of the register, for producing a first check signal which has a first state when any of the storage elements of the first set has said first value and which has a second state when all of the storage elements of the first set have said second value;
   second check means, connected operatively to the remaining storage elements of the register which form a second set of two or more consecutive storage elements, for producing a second check signal which has a first stage when any of the storage elements of the second set has said first value and which has a second state when all of the storage elements of the second set have said second value; and
   same state detection means connected to said first and second check means for producing a detection signal, indicating that said control pattern is incorrect, when said first and second check signals have the same state.

* * * * *

UNITED STATES PATENT AND TRADEMARK OFFICE
CERTIFICATE OF CORRECTION

PATENT NO. : 7,187,738 B2
APPLICATION NO. : 10/000036
DATED : March 6, 2007
INVENTOR(S) : Finbar Naven et al.

Page 1 of 1

It is certified that error appears in the above-identified patent and that said Letters Patent is hereby corrected as shown below:

Column 25, Line 27, after "claimed" insert --in--.

Column 25, Line 43, after "thereby" insert --,--.

Column 28, Line 51, change "companies" to --comprises--.

Signed and Sealed this

Twenty-sixth Day of February, 2008

JON W. DUDAS
*Director of the United States Patent and Trademark Office*